(12) United States Patent
Huang et al.

(10) Patent No.: US 6,710,639 B2
(45) Date of Patent: Mar. 23, 2004

(54) EMITTER TURN-OFF THYRISTORS AND THEIR DRIVE CIRCUITS

(75) Inventors: Oin Huang, Blacksburg, VA (US); Bin Zhang, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 10/378,606

(22) Filed: Mar. 5, 2003

(65) Prior Publication Data

US 2003/0168671 A1 Sep. 11, 2003

Related U.S. Application Data

(60) Provisional application No. 60/361,718, filed on Mar. 6, 2002.

(51) Int. Cl.[7] .............................................. H03K 17/72
(52) U.S. Cl. ....................................... 327/438; 327/440
(58) Field of Search ................................. 327/376, 377, 327/438, 440, 441, 470–474

(56) References Cited

U.S. PATENT DOCUMENTS

| | | | | |
|---|---|---|---|---|
| 4,581,543 A | * | 4/1986 | Herberg | 327/438 |
| 5,262,691 A | * | 11/1993 | Bailey et al. | 327/438 |
| 6,163,200 A | * | 12/2000 | Iijima | 327/438 |
| 6,426,666 B1 | * | 7/2002 | Li et al. | 327/438 |

* cited by examiner

Primary Examiner—My-Trang Nu Ton
(74) Attorney, Agent, or Firm—Whitham, Curtis & Christofferson, P.C.

(57) ABSTRACT

A family of emitter turn-off thyristors and their drive circuit comprise a gate turn-on (GTO) thyristor, a first switch, the drain of the first switch being connected to the cathode of the GTO thyristor, and a second switch connected between the gate of the GTO thyristor and the source of the first switch. The first switch consists of many paralleled metal oxide semiconductor field effect transistors (MOSFETs). The anode of the GTO thyristor and the source of the first switch serve as the annode and the cathode, respectively, of the emitter turn-off thyristor. The emitter turn-off thyristor has four control electrodes: the gate of the GTO thyristor, the control electrode of the second switch, the gate of the first switch, and the cathode of the GTO thyristor. The drive circuit comprises a current source circuit, a voltage clamp circuit, a current direction detector, and a control circuit. The ETO thyristor further comprises a current sensing and over-current detector circuit. The first switch is packaged in a printed circuit board.

46 Claims, 17 Drawing Sheets

EMITTER TURN-OFF THYRISTORS AND THEIR DRIVE CIRCUITS

CROSS REFERENCE TO RELATED APPLICATION

This application claims the benefit of provisional application No. 60/361,718 filed Mar. 6, 2002.

This application is related in subject matter to U.S. patent application Ser. No. 09/486,779 filed Mar. 2, 2000, by Alex Q. Huang for "Emitter Turn-off Thyristors (ETO)", the disclosure of which is incorporated herein by reference.

GOVERNMENT LICENSE RIGHTS

The U.S. Government has a paid-up license in this invention and the right in limited circumstances to require the patent owner to license other on reasonable terms as provided for by the terms of contract No. 00PDY263331 awarded by the Tennessee Valley Authority (TVA).

DESCRIPTION

BACKGROUND OF THE INVENTION

1. Field of the Invention

The present invention generally relates to the field of power electronics. More specifically, the present invention relates to several newly improved versions of the emitter turn-off thyristors and their drive circuits.

2. Background Description

The gate turn-off (GTO) thyristor is a four-layer semiconductor device of the structure PNPN, usually fabricated on a single wafer up to six inches in diameter. In the on-state it exhibits a latching behavior which enables it to achieve very low conduction loss at a high current density. Unfortunately, this latched state causes problems when the device turns off. This is because some parts of the die (cells) remain latched even when the anode voltage begins to rise, leading to a poor safe operating area (SOA). A bulky snubber capacitor is required to protect the GTO thyristor during the turn-off process. The discharge of this snubber capacitor requires significant power dissipation by a resistor or the use of complex energy recovery circuits, leading to increased system size and complexity. Turning the GTO thyristor off requires a gate current equal to approximately one fifth to one third of the anode current which must be supplied for a long time by the gate driver.

The turn-off performance of the conventional GTO thyristor can be dramatically improved by driving the gate current to be greater than or equal to the anode current during turn-off. In this condition, referred to as unity-gain or hard-driven, the upper NPN transistor turns off very quickly while the GTO thyristor is still in the conduction state. If this transistor is completely off before the PNP portion of the thyristor turns off, then there is no positive feedback loop present during the voltage rise phase. The PNP transistor with the base open is very robust, especially compared to the latched turn-off of a GTO thyristor. When the unity gain condition is satisfied the current distribution is very uniform across the entire die during the turn-off transient. This gives a much larger SOA than the GTO thyristor has. One of the devices that can achieve unity-gain turn-off is an emitter turn-off (ETO) thyristor as disclosed in application Ser. No. 09/486,779.

FIG. 1A shows the ETO thyristor equivalent circuit, and FIG. 1B shows the cross section of the ETO thyristor mechanical structure. The ETO thyristor has an additional switch 11 in series with the cathode of the GTO thyristor. The cathode of the GTO thyristor 10 is the emitter of the internal NPN transistor, so the series switch 11 is referred to as the emitter switch. Turning off this switch applies a high transient voltage long enough to commutate the current from the cathode to the gate of the GTO thyristor 10 so that unity-gain is achieved. An additional switch 12 is connected to the gate of the GTO thyristor, and is complementary to the emitter switch. These switches are implemented with many paralleled low-voltage voltage, high-current metal oxide semiconductor field effect transistors (MOSFETs).

However, when an anode short GTO thyristor or a transparent emitter GTO thyristor is used to build the ETO thyristor (this is the usual condition), there will be a parasitic diode present from gate to anode of the GTO thyristor. When used in high power voltage source converters, the ETO thyristor is usually connected with its anti-parallel freewheeling diode to form a switch that can block unidirectional voltage and conduct bi-directional current. When the anti-parallel diode conducts current, the parasitic diode of the ETO thyristor may also come into conduction if the voltage drop of the path through the ETO thyristor is comparable to that of the freewheeling diode. In other words, there is a parasitic reverse current conduction path in the ETO thyristor. This is likely to occur during both the ETO thyristor gated "on" and the ETO thyristor gated "off" conditions. If the ETO thyristor starts to block the positive voltage right after its parasitic diode conducting current, the ETO thyristor failure may occur due to the poor reverse recovery performance of the ETO thyristor's parasitic diode.

Also, when the ETO thyristor turns off, there is a current which is equal to the anode current flow through the gate stray inductor. In this condition, a resonant process may occur involving the stray inductance of the gate loop, the junction capacitance of the GTO thyristor, and the recovering diode of the ETO thyristor's emitter switch. When the resonant current flow is into the gate and out of the cathode of the GTO thyristor, it may initiate a retriggering of the GTO thyristor, which leads to turn-off failure.

Additionally, it can be seen from FIG. 1B that the gate switch and the emitter switch are all mounted on the copper disc. This mechanical structure makes the ETO thyristor difficult to produce.

SUMMARY OF THE INVENTION

It is therefore an object of the present invention to supply a family of improved emitter turn-off (ETO) thyristors that eliminate the reverse current path, are more reliable to switch, and have an improved housing, allowing it to be produced more easily.

A further purpose of this invention is to provide efficient drive circuits for the ETO thyristors. The drive circuit can block the turn-on command during the time when the anti-parallel diode conducting current. This function can save energy for the drive circuit and improve reliability of the ETO thyristor in a pulse width modulated (PWM) converter application condition.

Furthrmore, this invention provides a self-powered ETO dirve method. Using this method, no individual power input is needed for the driving circuit. This self-powered ETO thyristor and its drive circuit greatly improve the reliability and reduce the cost.

According to one aspect of the invention, there is provided an emitter turn-off thyristor comprising a gate turn-on (GTO) thyristor, a first switch, the drain of the first switch being connected to the cathode of the GTO thyristor, and a second switch connected between the gate of the GTO thyristor and the source of the first switch. The first switch consists of a number of paralleled metal oxide semiconductor field effects transistors (MOSFETs). The anode of the GTO thyristor and the source of the first switch serve as the annode and the cathode, respective, of the emitter turn-off thyristor. The emitter turn-off thyristor has four control electrodes; the gate of the GTO thyristor, the control electrode of the second switch, the gate of the first switch, and the cathode of the GTO thyristor.

In a first embodiment, the second switch consists of a number of paralleled MOSFETs. In addition, the MOSFETs are connected series with a diode. The diode serves to block current from the source of the second switch to the anode of the GTO thyristor.

In a second embodiment, the second switch consists of a number of paralleled insulated gate bipolar transistors (IGBTs). The collector of the second switch is connected to the gate of the GTO thyristor, and the emitter of the second switch is connected to the source of the first switch.

In a third embodiment, the second switch consists of a series circuit of a switch and a capacitor. There is a first diode connected in parallel with the switch, and the second diode connected in parallel with the capacitor.

In a fourth embodiment, a series circuit of a first diode and a capacitor, and this series circuit being connected in parallel with the first switch. The voltage across the first switch will be clamped by the capacitor during the turn-off transient. The power stored in the capacitor can be used to drive for the control circuit of the ETO thyristor.

Another object of the present invention is to provide a novel ETO thyristor current sensing circuit and a new over-current detection circuit. The output of the current sensing circuit can be used for current control purpose and the output of the over-current detection circuit can be used for over-current protection purpose.

In addition to the family of improved emitter turn-off thyristors and their drive circuits, it is another object of the invention to provide an improved housing of the ETO thyristor. This improved housing, in addition to providing better operation of the ETO thyristor, is designed in such a way as to make it easier to manuracture.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
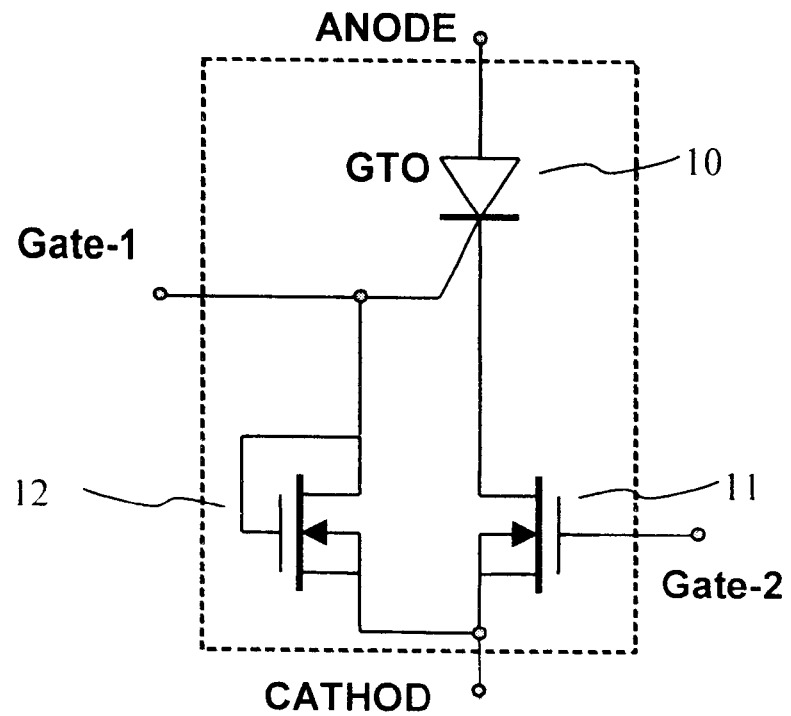
FIG. 1A is an equivalent circuit diagram of an emitter turn-off (ETO) thyristor.
Figure 1B:
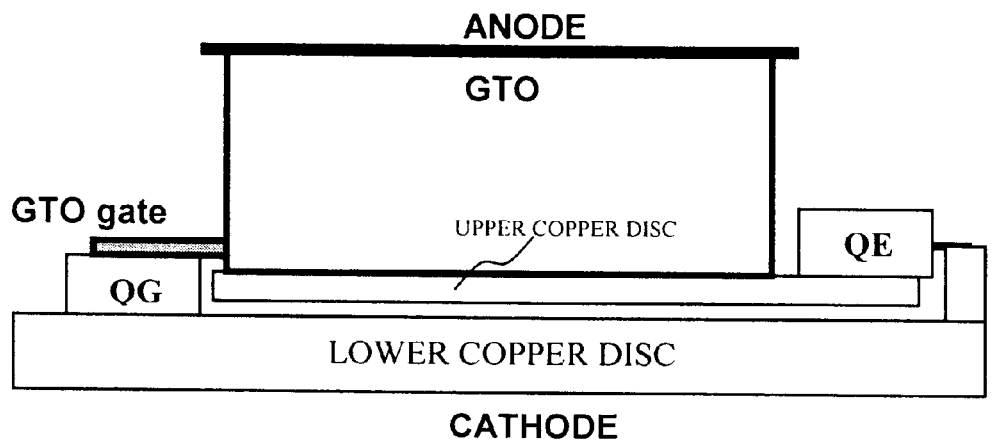
FIG. 1B is the cross-sectional view of the ETO thyristor mechanical structure of FIG. 1A.
Figure 2:
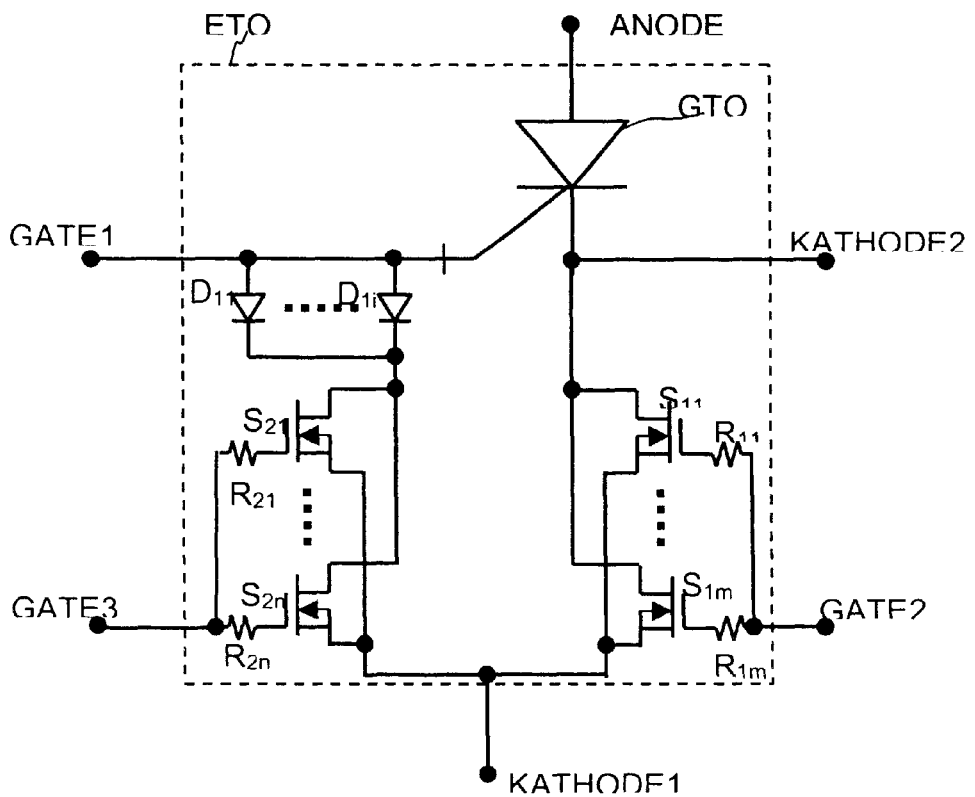
FIG. 2 is an equivalent circuit diagram of an ETO thyristor according to a first embodiment of the invention.

Referring again to the drawings, and more particularly now to FIG. 2, there is shown an equivalent circuit diagram of an ETO thyristor according to a first embodiment of the invention. In this structure, a number (m pieces, in the depicted example, m=68) of paralleled MOSFETs, $S_{11} \sim S_{1m}$, are used to build the emitter switch. There are also resistors $R_{11} \sim R_{1m}$ connect to the gates of the MOSFETs. The drains of $S_{11} \sim S_{1m}$ connect to the cathode of the GTO thyristor. Between the cathodes of emitter switch $S_{11} \sim S_{1m}$ and the gate of the GTO thyristor, there is a series circuit of a gate switch and a gate diode. A number (n pieces, in the depicted example, n=12) of paralleled MOSFETs, $S_{11} \sim S_{1n}$, are used to build the gate switch. There are resistors $R_{11} \sim R_{1n}$ connect to the gates of the MOSFETs. And there are a number (i pieces, in the depicted example, i=12) of paralleled diodes, $D_{11} \sim D_{1i}$ are used to build the gate diode. The anode of the GTO thyristor, ANODE, and the sources of $S_{11} \sim S_{1m}$, KATHODE1, are defined the anode and the cathode of ETO thyristor respectively. There are four control pins; GATE1 is the gate of the GTO thyristor, GATE2 is the control input of $S_{11} \sim S_{1n}$, GATE3 is the control input of $S_{11} \sim S_{1m}$, and KATHOD2 is the cathode of GTO thyristor. To turn off the ETO thyristor, turn off emitter switch $S_{11} \sim S_{1m}$ and turn on gate switch $S_{11} \sim S_{1n}$. To turn on the ETO thyristor, turn on emitter switch $S_{11} \sim S_{1m}$, turn off gate switch $S_{11} \sim S_{1n}$, and inject current into GATE1. $D_{11} \sim D_{1i}$ are used to block the current from KATHODE1 to ANODE when voltage of KATHODE1 is higher than the voltage of ANODE in the PWM voltage source converter application.

Figure 3:
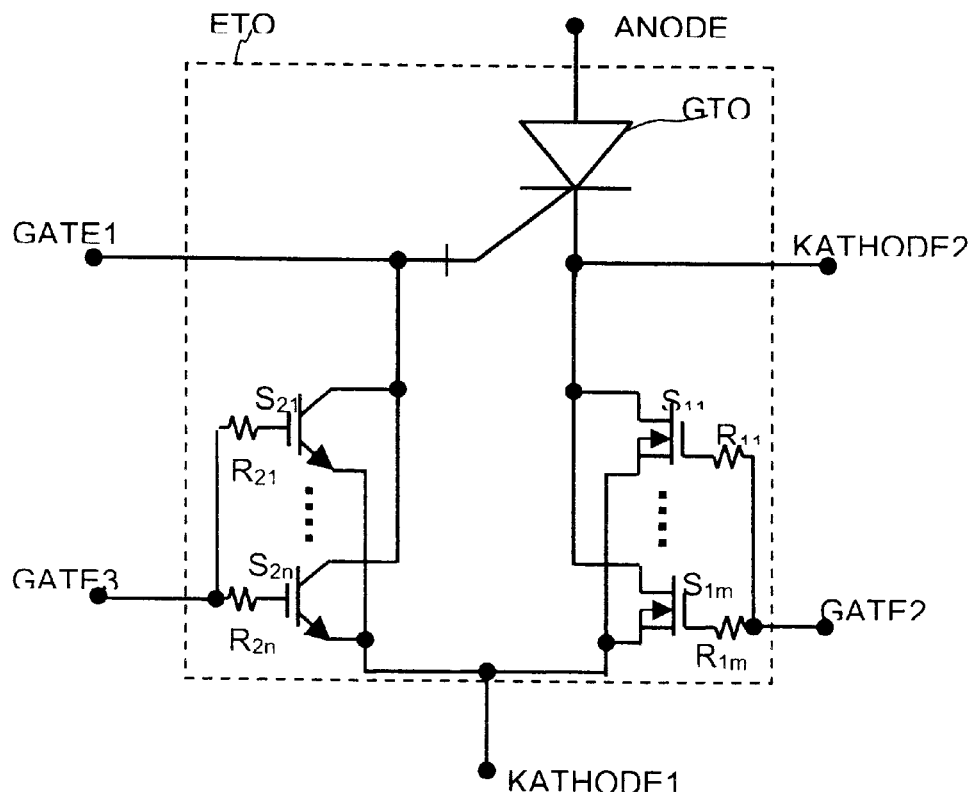
FIG. 3 is an equivalent circuit diagram of an ETO thyristor according to a second embodiment of the invention.

Referring now to FIG. 3 there is an equivalent circuit diagram of an ETO thyristor according to a second embodiment of the invention. In this structure, a number (m pieces, in the depicted example, m=68) of paralleled MOSFETs, $S_{11} \sim S_{1m}$, are used to build the emitter switch. There are also resistors $R_{11} \sim R_{1m}$ connect to the gates of the MOSFETs. The drains of $S_{11} \sim S_{1m}$ connect to the cathode of the GTO thyristor. A number (n pieces, in the depicted example, n=12) of paralleled insulated gate bipolar transistors (IGBTs) $S_{11} \sim S_{1n}$, are used to build the gate switch. There are also resistors $R_{11} \sim R_{1n}$ connect to the gates of the IGBTs. The anodes of $S_{11} \sim S_{1n}$ connect the gate of GTO thyristor. The sources of $S_{11} \sim S_{1m}$ and the sources of $S_{11} \sim S_{1n}$ are connected together. The anode of the GTO thyristor, ANODE, and the sources of $S_{11} \sim S_{1n}$ and $S_{11} \sim S_{1m}$, KATHODE1, are defined the anode and the cathode of ETO thyristor respectively. There are four control pins; GATE1 is the gate of the GTO thyristor, GATE2 is the control input of $S_{11} \sim S_{1n}$, GATE3 is the control input of $S_{11} \sim S_{1m}$, and KATHOD2 is the cathode of GTO thyristor. To turn off the ETO thyristor, turn off emitter switch $S_{11} \sim S_{1m}$ and turn on gate switch $S_{11} \sim S_{1n}$. To turn on the ETO thyristor, turn on emitter switch $S_{11} \sim S_{1m}$, turn off gate switch $S_{11} \sim S_{1n}$, and inject current into GATE1.

Figure 4:
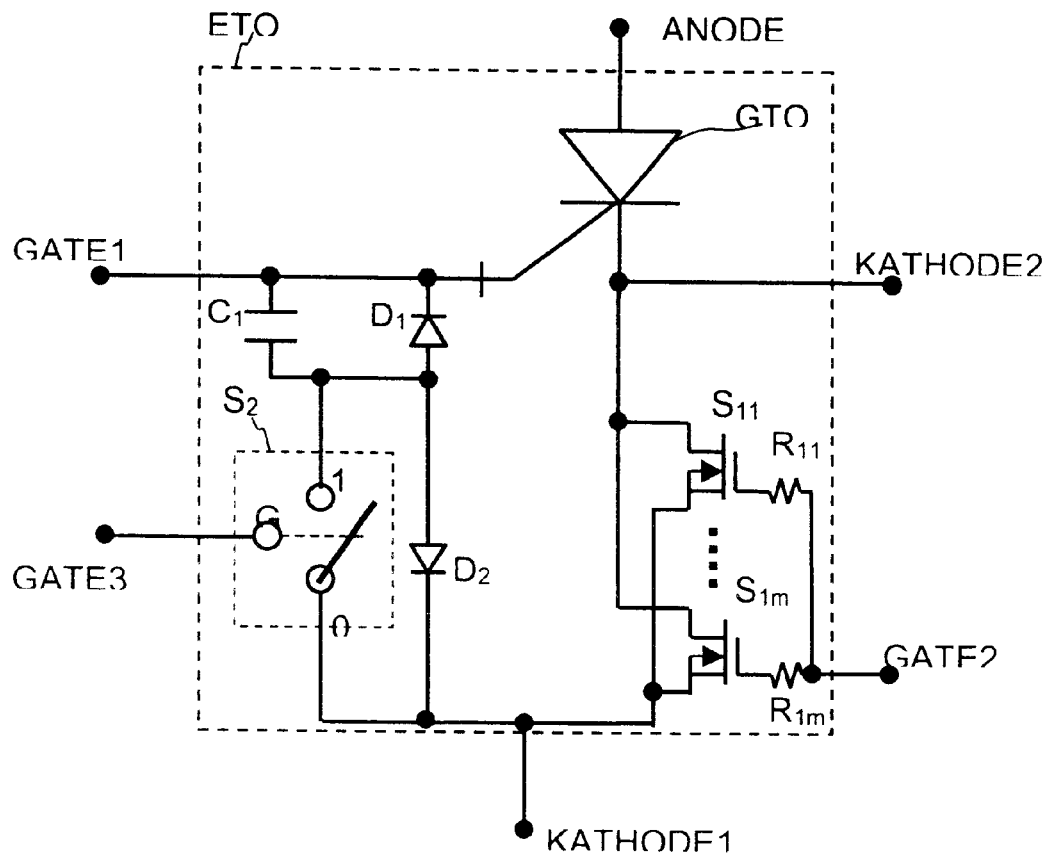
FIG. 4 is an equivalent circuit diagram of an ETO thyristor according to a third embodiment of the invention.

Referring now to FIG. 4 there is an equivalent circuit diagram of an ETO thyristor according to a third embodiment of the invention. In this structure, a number (mn pieces, in the depicted example, m=68) of paralleled MOSFETs, $S_{11} \sim S_{1m}$, are used to build the emitter switch. There are also resistors $R_{11} \sim R_{1m}$ connect to the gates of the MOSFETs. The drains of $S_{11} \sim S_{1m}$ connect to the cathode of the GTO thyristor. Between the cathodes of emitter switch $S_{11} \sim S_{1m}$ and the gate of the GTO thyristor, there is a series circuit of a gate switch $S_2$ and a capacitor $C_1$. $S_2$ has three terminals among which G is the control input. There is a diode $D_1$ which is connected in parallel with $C_1$. And there is a diode $D_2$ which is connected in parallel with $S_2$. The anode of the GTO thyristor ANODE, and the sources of $S_{11} \sim S_{1n}$ KATHODE1 are defined the anode and the cathode of ETO thyristor respectively. There are four control pins; GATE1 is the gate of the GTO thyristor, GATE2 is the control input of $S_{11} \sim S_{1n}$, GATE3 is connected to the control input of $S_2$, and KATHOD2 is the cathode of GTO thyristor. To turn off the ETO thyristor, turn off emitter switch $S_{11} \sim S_{1m}$ and turn off gate switch $S_2$. The current will go out of the gate of GTO thyristor and charge capacitor C1 through $D_2$. To turn on the ETO thyristor, turn on emitter switch $S_{11} \sim S_{1m}$ and turn on gate switch $S_2$. C1 will provide the turn on current so that only small constant current is needed for the drive circuit to be injected into GATE1. Gate switch $S_2$ is used to block the current from KATHOD1 to ANODE when voltage of KATHOD1 is higher than the voltage of ANODE in the PWM voltage source converter application. Diode D1 is used to provide a current free wheeling path when C1 is discharged.

Figure 5:
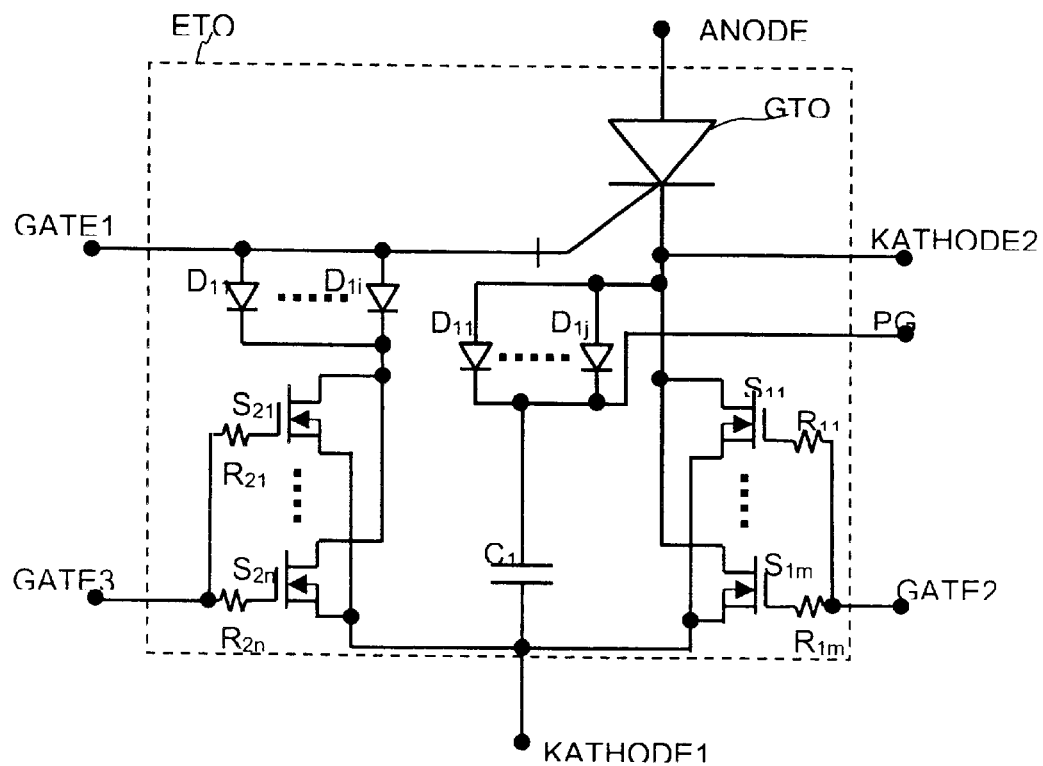
FIG. 5 is an equivalent circuit diagram of an ETO thyristor according to a fourth embodiment of the invention.

Referring now to FIG. 5 there is an equivalent circuit diagram of an ETO thyristor according to a fourth embodiment of the invention. In this structure, a number (m pieces, in the depicted example, m=68) of paralleled MOSFETs, $S_{11} \sim S_{1m}$, are used to build the emitter switch. There are also resistors $R_{11} \sim R_{1m}$ connect to the gates of the MOSFETs. The drains of $S_{11} \sim S_{1m}$ connect to the cathode of the GTO thyristor. Between the cathodes of emitter switch $S_{11} \sim S_{1m}$ and the gate of the GTO thyristor, there is a series circuit of a gate switch and a gate diode. A number (n pieces, in the depicted example, n=12) of paralleled MOSFETs, $S_{11} \sim S_{1n}$, are used to build the gate switch. There are resistors $R_{11} \sim R_{1n}$ which are connected to the gates of the MOSFETs. And a number (i pieces, in the depicted example, i=12) of paralleled diodes, $D_{11} \sim D_{1i}$ are used to build the gate diode. There is a series circuit of a number (i pieces, in the depicted example, j=12) of paralleled diodes $D_{11} \sim D_{1j}$ and a capacitor $C_1$, and this series circuit is connect in parallel with the emitter switch $S_{11} \sim S_{1n}$. The anode of the GTO thyristor, ANODE, and the sources of $S_{11} \sim S_{1n}$ and $S_{11} \sim S_{1m}$, KATHODE1, are defined the anode and the cathode of ETO thyristor respectively. There are five control pins; GATE1 is the gate of the GTO thyristor, GATE2 is the control input of $S_{11} \sim S_{1n}$, GATE3 is the control input of $S_{11} \sim S_{1m}$, KATHOD2 is the cathode of GTO thyristor, and PG is the cathodes of $D_{11} \sim D_{1j}$. To turn off the ETO thyristor, turn off emitter switch $S_{11} \sim S_{1m}$ and turn on gate switch $S_{11} \sim S_{1n}$. The anode voltage of the emitter switch $S_{11} \sim S_{1m}$ will be clamped to the voltage across $C_1$. To turn on the ETO thyristor, turn on emitter switch $S_{11} \sim S_{1m}$, turn off gate switch $S_{11} \sim S_{1n}$, and inject current into GATE1. The turn-on action of emitter switch $S_{11} \sim S_{1m}$ can be delayed in order to charge $C_1$. $D_{11} \sim D_{1i}$ are used to block the current from KATHODE1 to ANODE when voltage of KATHODE1 is higher than the voltage of ANODE in the PWM voltage source converter application.

Figure 6:
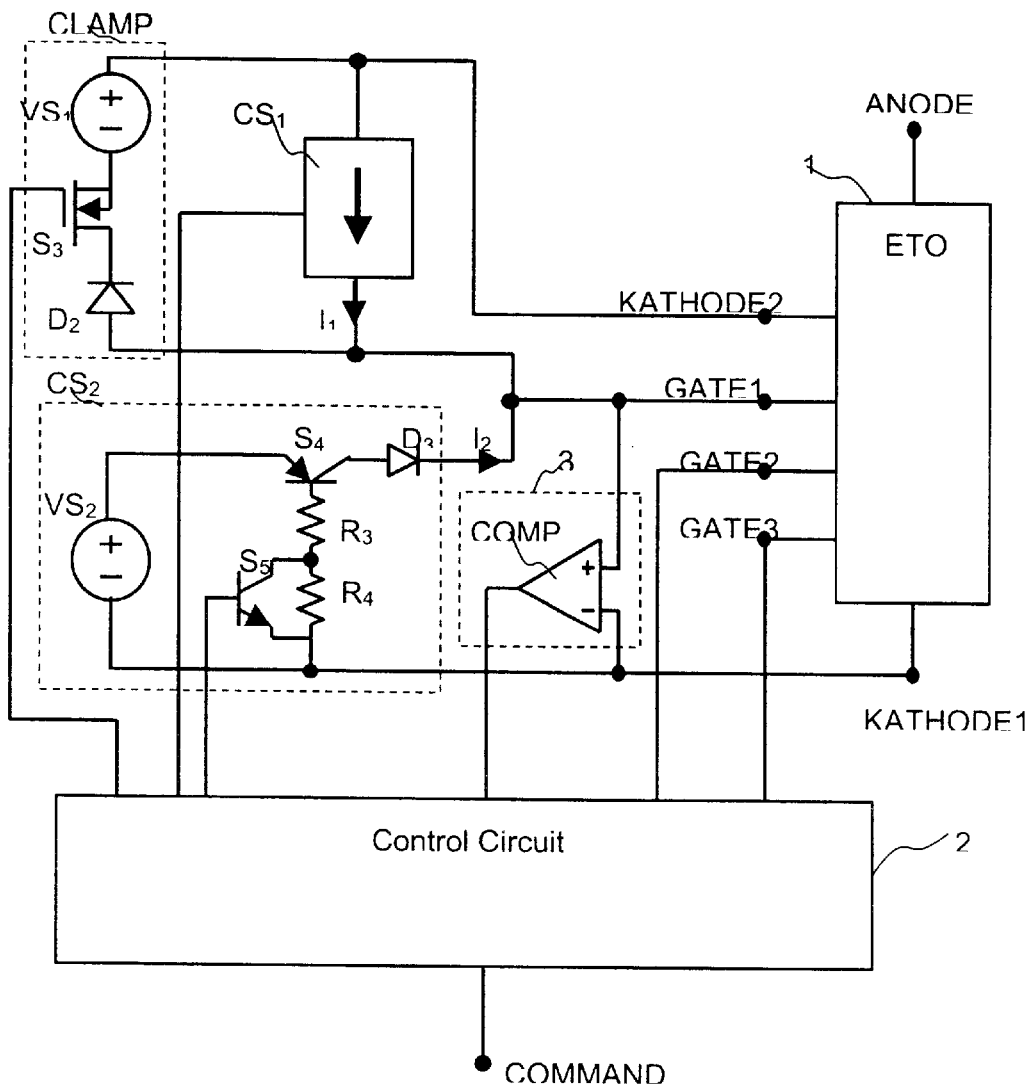
FIG. 6 is an equivalent circuit diagram of an ETO thyristor driving circuit according to a fifth embodiment of the invention.

Referring now to FIG. 6 there is an equivalent circuit diagram of an ETO thyristor drive circuit according to a fifth embodiment of the invention. In this structure, the ETO thyristor 1 is according the first embodiment of the invention as shown in FIG. 2. The ETO thyristor drive circuit includes a pulse current source $CS_1$, a DC current source circuit $CS_2$, and voltage clamp circuit CLAMP, a current direction detector 3, and the Control Circuit 2. $CS_1$ connects to KATHODE2 and GATE1. $CS_1$ is to provide a pulse current to the GTO thyristor's gate when ETO thyristor's is turned on. $CS_2$ connects to KATHODE1 and GATE1. $CS_2$ is to provide a DC current to the GTO thyristor's gate during ETO thyristor's on state. In the depicted example, $CS_2$ includes a voltage source VS2, a PNP power transistor $S_4$, two resistors $R_3$ and $R_4$, a transistor $S_5$, and a diode $D_3$ which is used to block the voltage when the voltage of GATE1 is bigger than the $VS_2$. The clamp circuit CLAMP is connected to KATHODE2 and GATE1. CLAMP is to make gate of the GTO thyristor reverse bias during its off state to prevent its false trig on. In the depicted example, CLAMP is a series circuit of a voltage source $VS_1$, a MOSFET $S_3$, and a diode $D_2$. Current direction detector 3 is connected to GATE1 and KATHODE1. In the PWM voltage source converter application, there will be a diode connected in anti-parallel with the ETO thyristor. Current direction detector 3 is used to detect whether that anti-parallel diode is conducting current. If the ETO thyristor's anti-parallel diode is conducting current, the ETO thyristor is kept off to save the power of the drive circuit. In the depicted example, current direction detector 3 is a comparator COMP. If the output of COMP is low during the operation, it is indicated that the ETO thyristor's anti-parallel diode is conducting current. In this case, the ETO thyristor is kept off to save the power of the drive circuit. So the ETO thyristor will be turned on only if COMMAND is high and the output of COMP is high. The ETO thyristor 1 and its drive circuit are controlled by control circuit 2.

Figure 7:
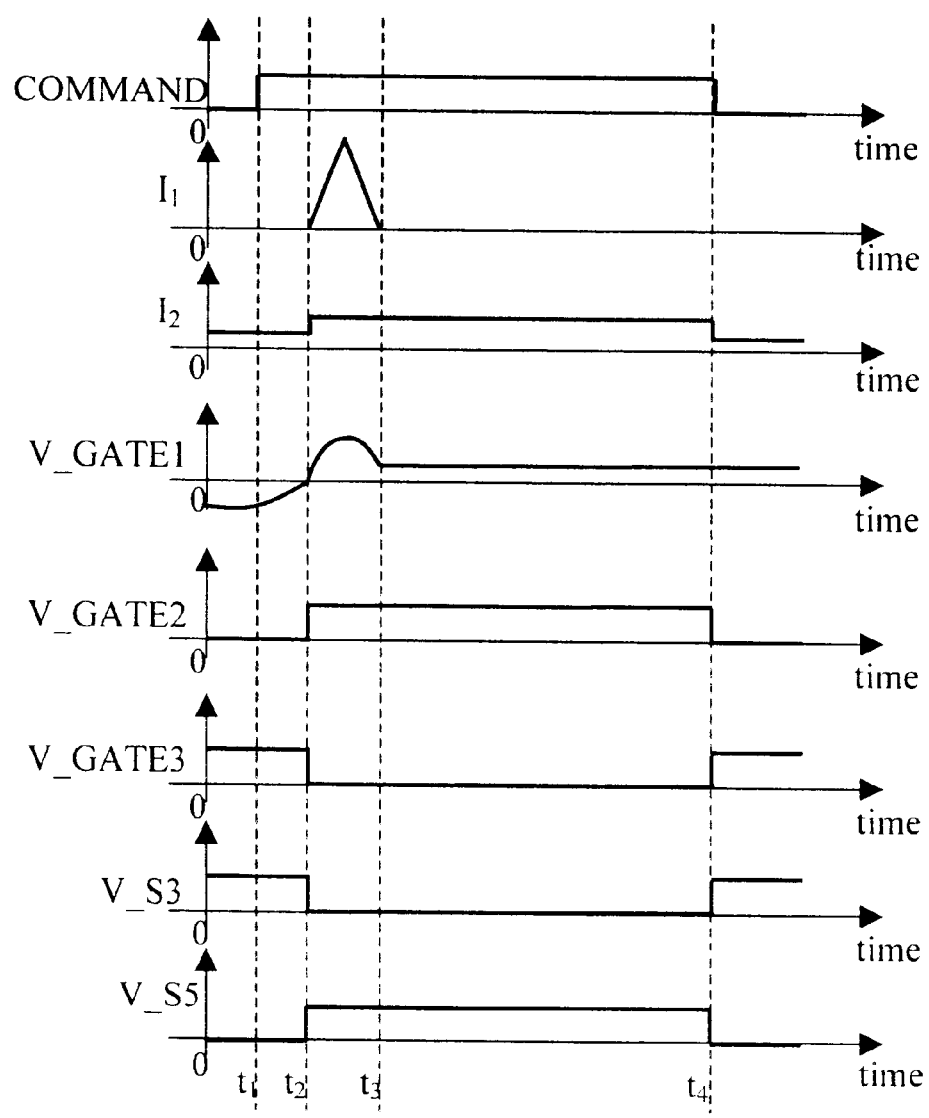
FIG. 7 is an ETO thyristor driver timing diagram according to a fifth embodiment of the invention.

Referring now to FIG. 7 there is an ETO thyristor driver timing diagram also according to the fifth embodiment of the invention as shown in FIG. 6. In FIG. 7, COMMAND is the control signal to trig the on/off of the ETO thyristor; $I_1$ is the output of $CS_1$; $I_2$ is the output of $CS_2$; V_GATE1 is the voltage across GATE1 and KATHODE1; V_GATE2 is the voltage across GATE2 and the cathodes of the emitter switch $S_{11} \sim S_{1m}$; V_GATE3 is the voltage across GATE3 and the cathodes of the gate switch $S_{11} \sim S_{1n}$; V_S3 is the voltage across the gate and cathodes of $S_3$; V_S5 is the voltage across the gate and cathodes of $S_5$. At time $t_1$, COMMAND is high. Since V_GATE1 is negative, the ETO thyristor output of COMP is low. ETO thyristor is kept off. At time $t_2$, the voltage of the GTO thyristor's gate is higher than the ETO thyristor's cathode. At this time, both COMMAND and the output of COMP are high. Then the turn-on action is initiated by control circuit 2. $CS_1$ is trigged to inject a current pulse $I_1$ to GATE1. V_GATE2 is changed from low level to high level to turn on ETO thyristor's emitter switch $S_{11} \sim S_{1m}$. V_GATE3 is changed from high level to low level to turn off ETO thyristor's gate switch $S_{11} \sim S_{1n}$. V_S3 is changed from high level to low level to turn off CLAMP. V_S5 is changed from low level to high level to turn on $S_4$. Since $S_4$ is turned on, $I_2$ is increased. At time $t_3$, I2 decreases to zero. The current pulse injection finishes. The GTO thyristor's gate current is maintained only by $I_2$. At time $t_4$, COMMAND is low. The turn-off action is initiated by Control Circuit 2 immediately. V_GATE2 is changed from high level to low level to turn off ETO thyristor's emitter switch $S_{11} \sim S_{1m}$. V_GATE3 is changed from low level to high level to turn on ETO thyristor's gate switch $S_{11} \sim S_{1n}$. Since ETO thyristor's emitter switch $S_{11} \sim S_{1m}$ are turned off, there will be a positive voltage generated across the emitter and the drain of $S_{11} \sim S_{1m}$, forcing the current divert from the cathode to the gate of the GTO thyristor, to achieve so-called unity turn-off gain. V_S3 is changed from low level to high level to turn on CLAMP so as to make gate of the GTO thyristor reverse bias during its off state. V_S5 is changed from high level to low level to turn off $S_4$. Since $S_4$ is turned off, $I_2$ is decreased. As a result, the drive circuit power is saved.

Figure 8:
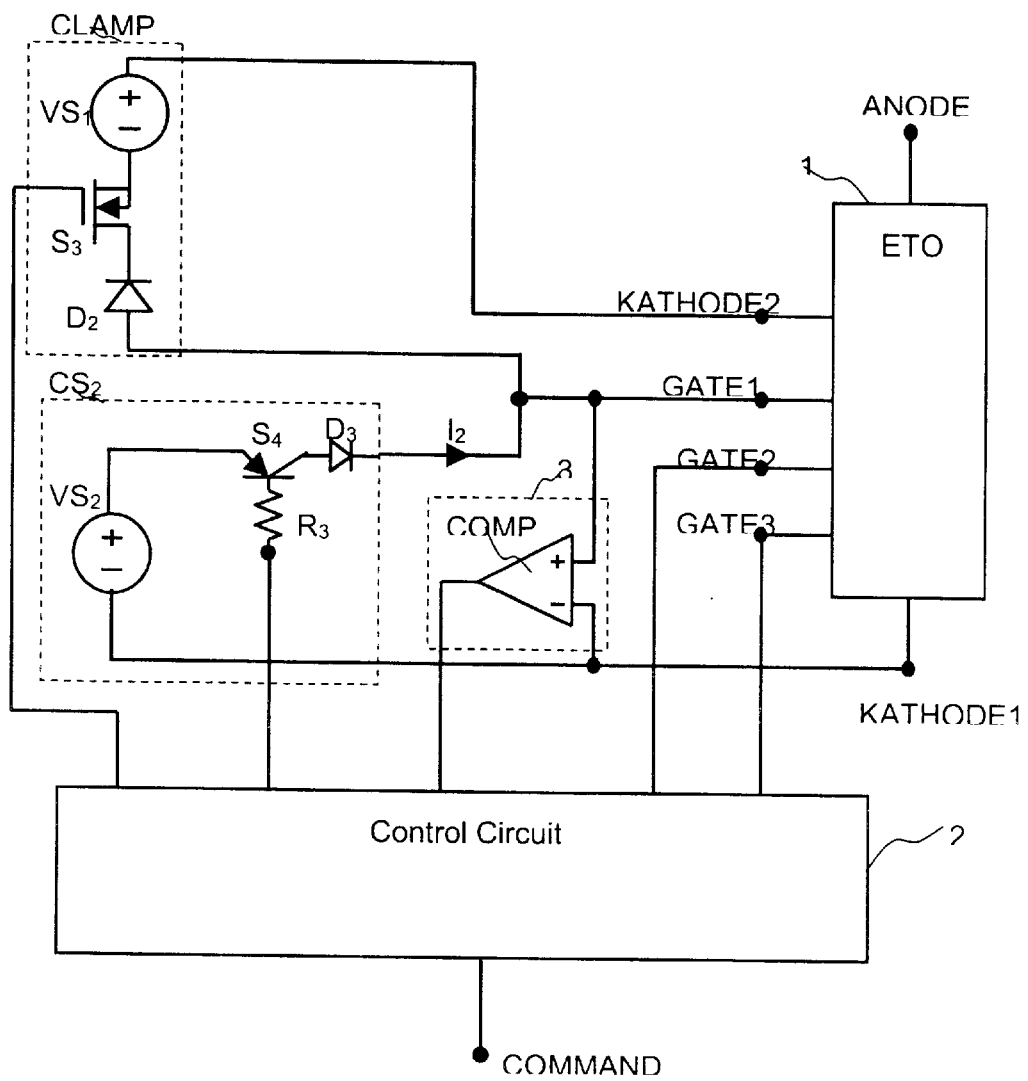
FIG. 8 is an equivalent circuit diagram of an ETO thyristor driving circuit according to a sixth embodiment of the invention.

Referring now to FIG. 8 there is an equivalent circuit diagram of an ETO thyristor drive circuit according to a sixth embodiment of the invention. In this structure, the ETO thyristor 1 is according the third embodiment of the invention as shown in FIG. 4. The ETO thyristor drive circuit includes a DC current source circuit $CS_2$, voltage clamp circuit CLAMP, Current direction detector 3, and the control circuit 2. $CS_2$ connects to KATHODE1 and GATE1. $CS_2$ is to provide a DC current to the GTO thyristor's gate during ETO thyristor's on state. In the depicted example, $CS_2$ includes a voltage source VS2, a PNP power transistor $S_4$, two resistors $R_3$ and $R_4$, a transistor $S_5$, and a diode $D_3$ which is used to block the voltage when the voltage of GATE1 is bigger than the $VS_2$. The clamp circuit CLAMP is connected to KATHODE2 and GATE1. CLAMP is to make gate of the GTO thyristor reverse bias during its off state to prevent its false trig on. In the depicted example, CLAMP is a series circuit of a voltage source $VS_1$, a MOSFET $S_3$, and a diode $D_2$. Current direction detector 3 is connected to GATE1 and KATHODE1. In the PWM voltage source converter application, there will be a diode connected in anti-parallel with the ETO thyristor. Current direction detector 3 is used to detect whether that anti-parallel diode is conducting current. If the ETO thyristor's anti-parallel diode is conducting current, the ETO thyristor is kept off to save the power of the drive circuit. In the depicted example, current direction detector 3 is a comparator COMP. If the output of COMP is low during the operation, it is indicated that the ETO thyristor's anti-parallel diode is conducting current. In this case, the ETO thyristor is kept off to save the power of the drive circuit. So the ETO thyristor will be turned on only if COMMAND is high and the output of COMP is high. The ETO thyristor 1 and its drive circuit are controlled by control circuit 2.

Figure 9:
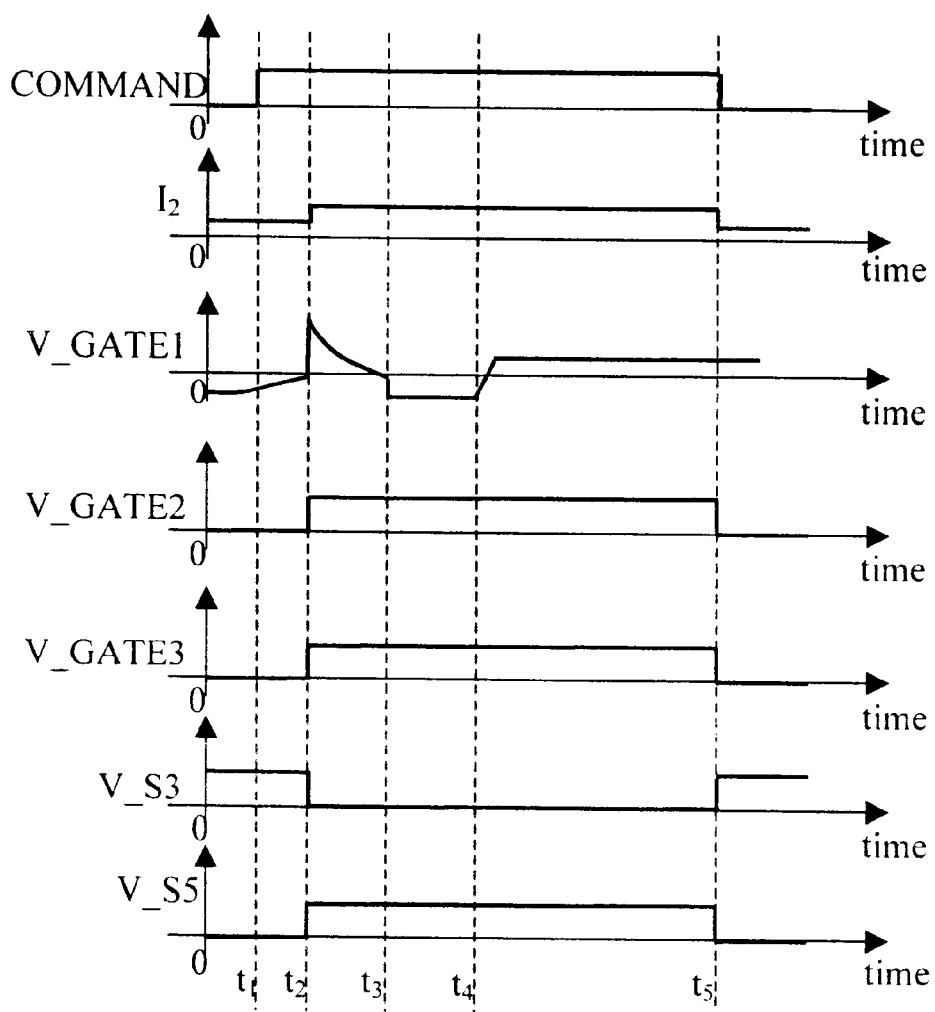
FIG. 9 is an ETO thyristor driver timing diagram according to a sixth embodiment of the invention.

Referring now to FIG. 9 there is an ETO thyristor driver timing diagram also according to the sixth embodiment of the invention. In FIG. 9, COMMAND is the control signal to trig the on/off of the ETO thyristor; $I_1$ is the output of $CS_1$; $I_2$ is the output of $CS_2$; V_GATE1 is the voltage across GATE1 and KATHODE1; V_GATE2 is the voltage across GATE2 and the cathodes of the emitter switch $S_{11} \sim S_{1m}$; V_GATE3 is the control voltage of GATE3; V_S3 is the voltage across the gate and cathodes of $S_3$; V_S5 is the voltage across the gate and cathodes of $S_5$. At time $t_1$, COMMAND is high. Since V_GATE1 is negative, the ETO thyristor output of COMP is low. ETO thyristor is kept off. At time $t_2$, the voltage of the GTO thyristor's gate is higher than the ETO thyristor's cathode. At this time, both COMMAND and the output of COMP are high. Then the turn-on action is initiated by control circuit 2. V_GATE2 is, changed from low level to high level to turn on ETO thyristor's emitter switch $S_{11} \sim S_{1m}$. V_GATE3 is changed from high level to low level to turn on $S_2$. Then capacitor $C_1$ provides a turn-on current to the gate of GTO thyristor. V_S3 is changed from high level to low level to turn off CLAMP. V_S5 is changed from low level to high level to turn on $S_4$. Since $S_4$ is turned on, $I_2$ is increased. At time $t_3$, capacitor $C_1$ has been discharged, but the loop inductance of the GTO thyristor's gate will maintain the current. The current goes through diode $D_1$. At time $t_4$, the energy stored in the gate loop inductance is totally released. The current going into the GTO thyristor's gate is provided by $I_2$ only. At time $t_5$, COMMAND is low. The turn-off action is initiated by control circuit 2 immediately. V_GATE2 is changed from high level to low level to turn off ETO thyristor's emitter switch $S_{11} \sim S_{1m}$. V_GATE3 is changed from high level to low level to turn off $S_2$. Since ETO thyristor's emitter switch $S_{11} \sim S_{1m}$ are turned off, there will be a positive voltage generated across the emitter and the drain of $S_{11} \sim S_{1m}$, forcing the current divert from the cathode to the gate of the GTO thyristor, to achieve so-called unity turn-off gain. The current flowing out of the GTO thyristor's gate will charge $C_1$ through $C_1$, and the energy stored in $C_1$ will be used for the ETO thyristor turn-on. At the same time, V_S3 is changed from low level to high level to turn on CLAMP so as to make gate of the GTO thyristor reverse bias during its off state. V_S5 is changed from high level to low level to turn off $S_4$. Since $S_4$ is turned off, the limitation of $I_2$ is decreased. As a result, the drive circuit power is saved.

Figure 10:
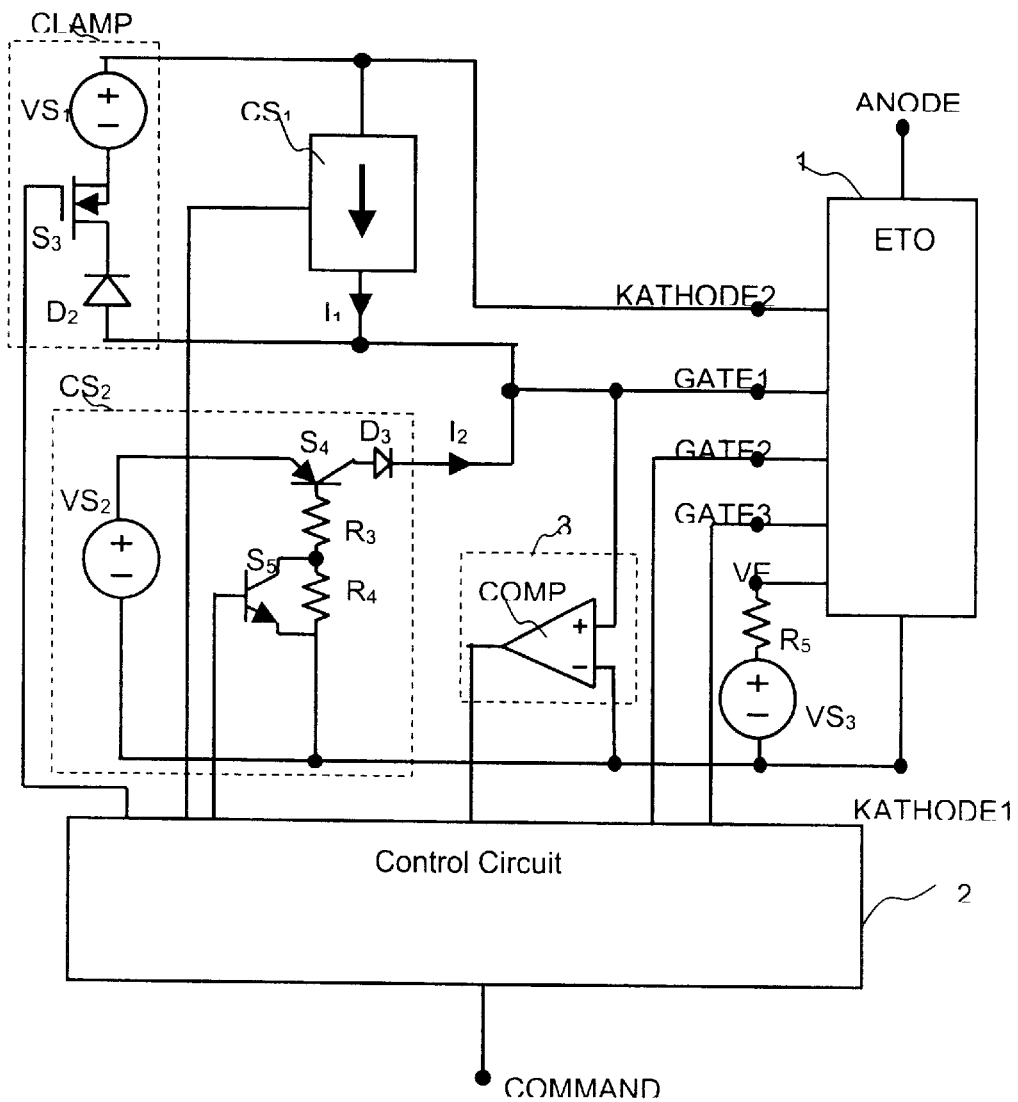
FIG. 10 is an equivalent circuit diagram of an ETO thyristor driving circuit according to a seventh embodiment of the invention.

Referring now to FIG. 10 there is an equivalent circuit diagram of an ETO thyristor drive circuit according to a seventh embodiment of the invention. In this structure, the ETO thyristor 1 is according the fourth embodiment of the invention shown in FIG. 5. The ETO thyristor drive circuit includes a pulse current source $CS_1$, a DC current source circuit $CS_2$, and voltage clamp circuit CLAMP, current direction detector 3, a series circuit of a DC voltage source $VS_3$ and a resistor $R_5$, and the control circuit 2. $CS_1$ connects to KATHODE2 and GATE1. $CS_1$ is to provide a pulse current to the GTO thyristor's gate when ETO thyristor's is turned on. $CS_2$ connects to KATHODE1 and GATE1. $CS_2$ is to provide a DC current to the GTO thyristor's gate during ETO thyristor's on state. In the depicted example, $CS_2$ includes a voltage source VS2, a PNP power transistor $S_4$, two resistors $R_3$ and $R_4$, a transistor $S_5$, and a diode $D_3$ which is used to block the voltage when the voltage of GATE1 is bigger than the $VS_2$. The series circuit of $VS_3$ and $R_5$ is connected between PG and KATHODE1. The clamp circuit CLAMP is connected to KATHODE2 and GATE1. CLAMP is to make gate of the GTO thyristor reverse bias during its off state to prevent its false trig on. In the depicted example, CLAMP is a series circuit of a voltage source $VS_1$, a MOSFET $S_3$, and a diode $D_2$. Current direction detector 3 is connected to GATE1 and KATHODE1. In the PWM voltage source converter application, there will be a diode connected in anti-parallel with the ETO thyristor. Current direction detector 3 is used to detect whether that anti-parallel diode is conducting current. If the ETO thyristor's anti-parallel diode is conducting current, the ETO thyristor is kept off to save the power of the drive circuit. In the depicted example, current direction detector 3 is a comparator COMP. If the output of COMP is low during the operation, it is indicated that the ETO thyristor's anti-parallel diode is conducting current. In this case, the ETO thyristor is kept off to save the power of the drive circuit. So the ETO thyristor will be turned on only if COMMAND is high and the output of COMP is high. The series circuit of $VS_3$ and $R_5$ is used to maintain a positive voltage across $C_1$ which is inside the ETO thyristor, and this voltage is lower than the avalanche break-down voltage of the ETO thyristor's emitter switch $S_{11} \sim S_{1m}$. The ETO thyristor 1 and its drive circuit are controlled by control circuit 2.

Referring now to FIG. 7 again, there is an ETO thyristor driver timing diagram also according to the seventh embodiment of the invention. In FIG. 7, COMMAND is the control signal to trig the on/off of the ETO thyristor; $I_2$ is the output of $CS_2$; V_GATE1 is the voltage across GATE1 and KATHODE1; V_GATE2 is the voltage across GATE2 and the cathodes of the emitter switch $S_{11} \sim S_{1m}$; V_GATE3 is the voltage across GATE3 and the cathodes of the gate switch $S_{11} \sim S_{1n}$; V_S3 is the voltage across the gate and cathodes of $S_3$; V_S5 is the voltage across the gate and cathodes of $S_5$. At time $t_1$, COMMAND is high. Since V_GATE1 is negative, the ETO thyristor output of COMP is low. ETO thyristor is kept off. At time $t_2$, the voltage of the GTO thyristor's gate is higher than the ETO thyristor's cathode. At this time, both COMMAND and the output of COMP are high. Then the turn-on action is initiated by control circuit 2. $CS_1$ is trigged to inject a current pulse $I_1$ to GATE1. V_GATE2 is changed from low level to high level to turn on ETO thyristor's emitter switch $S_{11} \sim S_{1m}$. V_GATE3 is changed from high level to low level to turn off ETO thyristor's gate switch $S_{11} \sim S_{1n}$. V_S3 is changed from high level to low level to turn off CLAMP. V_S5 is changed from low level to high level to turn on $S_4$. Since $S_4$ is turned on, $I_2$ is increased. At time $t_3$, $I_2$ decreases to zero. The current pulse injection finishes. The GTO thyristor's gate current is maintained only by $I_2$. At time t4, COMMAND is low. The turn-off action is initiated by control circuit 2 immediately. V_GATE2 is changed from high level to low level to turn off ETO thyristor's emitter switch $S_{11} \sim S_{1m}$. V_GATE3 is changed from low level to high level to turn on ETO thyristor's gate switch $S_{11} \sim S_{1n}$. Since ETO thyristor's emitter switch $S_{11} \sim S_{1m}$ are turned off, there will be a positive voltage, which is clamped by $C_1$ inside the ETO thyristor, generated across the emitter and the drain of $S_{11} \sim S_{1m}$, forcing the current divert from the cathode to the gate of the GTO thyristor, to achieve so-called unity turn-off gain. V_S3 is changed from low level to high level to turn on CLAMP so as to make gate of the GTO thyristor reverse bias during its off state. V_S5 is changed from high level to low level to turn off $S_4$. Since $S_4$ is turned off, $I_2$ is decreased. As a result, the drive circuit power is saved.

Figure 11:
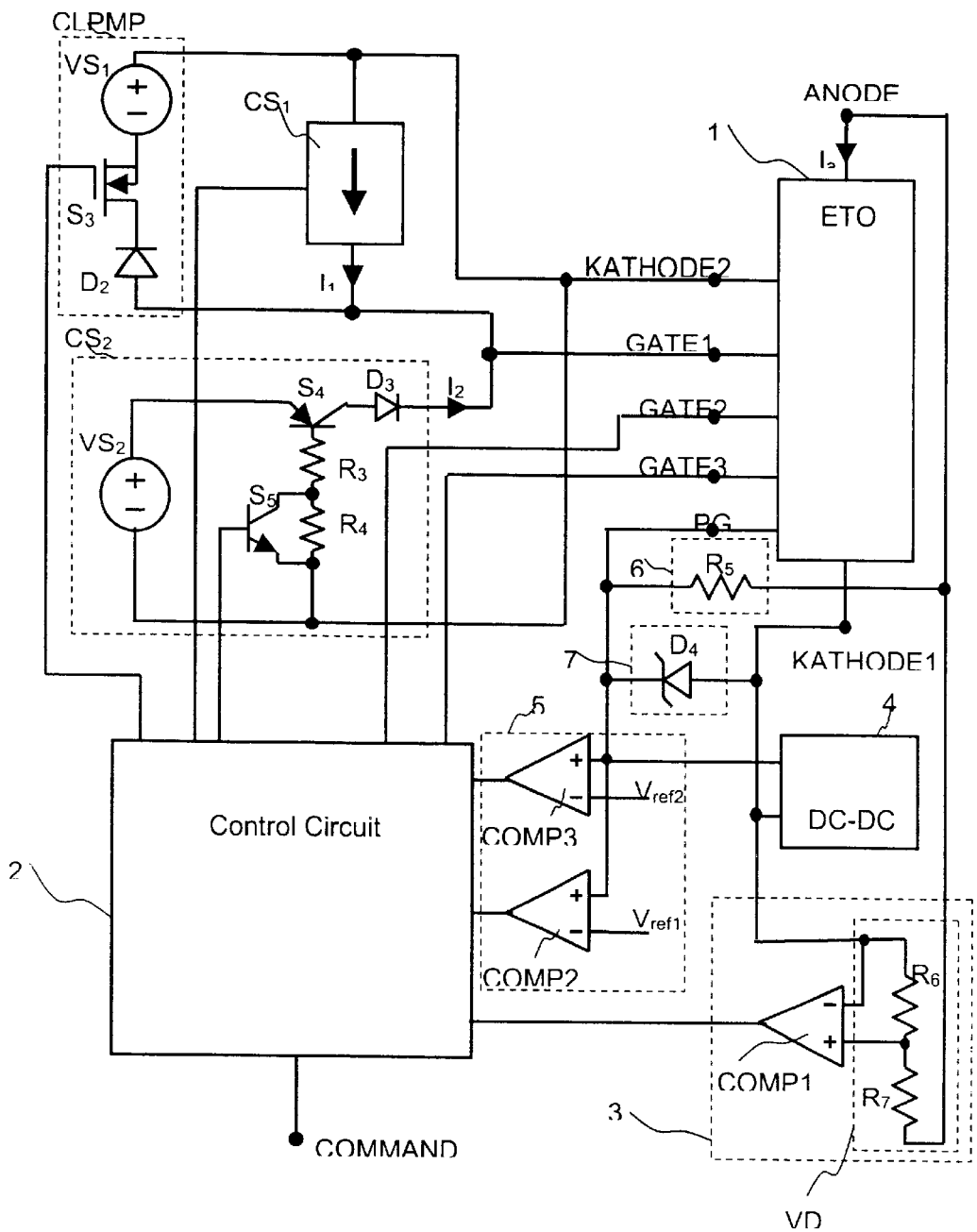
FIG. 11 is an equivalent circuit diagram of an ETO thyristor driving circuit according to an eighth embodiment of the invention.

Referring now to FIG. 11 there is an equivalent circuit diagram of an ETO thyristor drive circuit according to a eighth embodiment of the invention. In this structure, the ETO thyristor 1 is according the fourth embodiment of the invention, as shown in FIG. 5, and $I_a$ is its anode current. The ETO thyristor drive circuit includes a pulse current source $CS_1$, a DC current source circuit $CS_2$, and voltage clamp circuit CLAMP, current direction detector 3, PG voltage detector 5, PG voltage precharge circuit 6, PG voltage limiter 7, a DC—DC converter 4, and the control circuit 2. $CS_1$ connects to KATHODE2 and GATE1. $CS_1$ is to provide a pulse current to the GTO thyristor's gate when ETO thyristor's is turned on. $CS_2$ also connects to KATHODE2 and GATE1. $CS_2$ is to provide a DC current to the GTO thyristor's gate during ETO thyristor's on state. In the depicted example, $CS_2$ includes a voltage source VS2, a PNP power transistor $S_4$, two resistors $R_3$ and $R_4$, a transistor $S_5$, and a diode $D_3$ which is used to block the voltage when the voltage of GATE1 is bigger than the $VS_2$. The clamp circuit CLAMP is connected to KATHODE2 and GATE1. CLAMP is to make the gate of the GTO thyristor reverse bias during its off state to prevent its false trig on. In the depicted example, CLAMP is a series circuit of a voltage source $VS_1$, a MOSFET $S_3$, and a diode $D_2$. Current direction detector 3 is connected to ANODE and KATHODE1. In the PWM voltage source converter application, there will be a diode connected in anti-parallel with the ETO thyristor. Current direction detector 3 is used to detect whether that anti-parallel diode is conducting current. If the ETO thyristor's anti-parallel diode is conducting current, the ETO thyristor is kept off to save the power of the drive circuit. In the depicted example, the current direction detector 3 includes a comparator COMP1 and a voltage divider VD. VD is used to shift the voltage of ANODE, which is high voltage, to low voltage that can be received by the comparator. In the depicted example, VD is a series circuit of two resistors $R_6$ and $R_7$, and VD is connected to ANODE and KATHODE1. The negative input of COMP1 is connected to KATHODE1, and the positive input of COMP1 is connected to the other terminal of $R_6$. If the output of COMP1 is low during the operation, it is indicated that the ETO thyristor's anti-parallel diode is conducting current. In this case, the ETO thyristor is kept off to save the power of the drive circuit. So the ETO thyristor will be turned on only if COMMAND is high and the output of COMP1 is high. PG voltage detector 5 is connected to PG and control circuit 2, and it is used to detect the PG voltage and send the PG voltage information to control circuit 2. If PG is too low, control circuit 2 will delay the turn-on of emitter switch $S_{11} \sim S_{1m}$ so as to charge $C_1$ by anode current $I_a$. On the other hand, control circuit 2 will not delay the turn-on of emitter switch $S_{11} \sim S_{1m}$ if PG is high enough. In the depicted example, PG voltage detector 5 includes two comparators, COMP2 and COMP3, whose outputs are connected to control circuit 2. The positive inputs of COMP2 and COMP3 are connected to PG. There are also to voltage references, $V_{ref1}$ and $V_{ref2}$, and $V_{ref1}$ is lower than $V_{ref2}$. $V_{ref1}$ is connected to COMP2's negative input, and $V_{ref2}$ is connected to COMP3's negative input. During the ETO thyristor's turn-on or on-state, if PG is lower than $V_{ref1}$, the output of COMP2 is low, and control circuit 2 will keep emitter switch $S_{11} \sim S_{1m}$ off so as to charge $C_1$ by anode current $I_a$, and emitter switch $S_{11} \sim S_{1m}$ will not be turned on until PG rises to $V_{ref2}$, and the output of $V_{ref2}$ turns to high. On the other hand, if PG is bigger than $V_{ref1}$ at the beginning of the ETO thyristor's turn-on, control circuit 2 will not delay the turn-on of emitter switch $S_{11} \sim S_{1m}$. PG voltage precharge circuit 6 is connected between ANODE and PG, and it is used to charge $C_1$ when the ETO thyristor is first power on. PG voltage limiter 7 is connected between KATHODE1 and PG, and it is used to limit the voltage of PG to a voltage below than the avalanche break down voltage of emitter switch $S_{11} \sim S_{1m}$. In the depicted example, PG voltage precharge circuit 6 is a resistor $R_5$, and PG voltage limiter 7 is a zenor diode $D_4$. The input of DC—DC converter 4 is connected to PG and KATHODE1. The input power of DC—DC converter 4 is from the power stored in $C_1$. DC—DC converter 4 generates power for the total drive circuit, including $CS_1$, $CS_2$, CLAMP, current direction detector 3, PG voltage detector 5, PG voltage precharge circuit 6, PG voltage limiter 7, and the control circuit 2. So in this embodiment of the invention, no individual power input is needed for the driving circuit. This self-powered ETO thyristor and its drive circuit greatly improves the reliability and reduces the cost. The ETO thyristor 1 and its drive circuit are controlled by control circuit 2.

Figure 12:
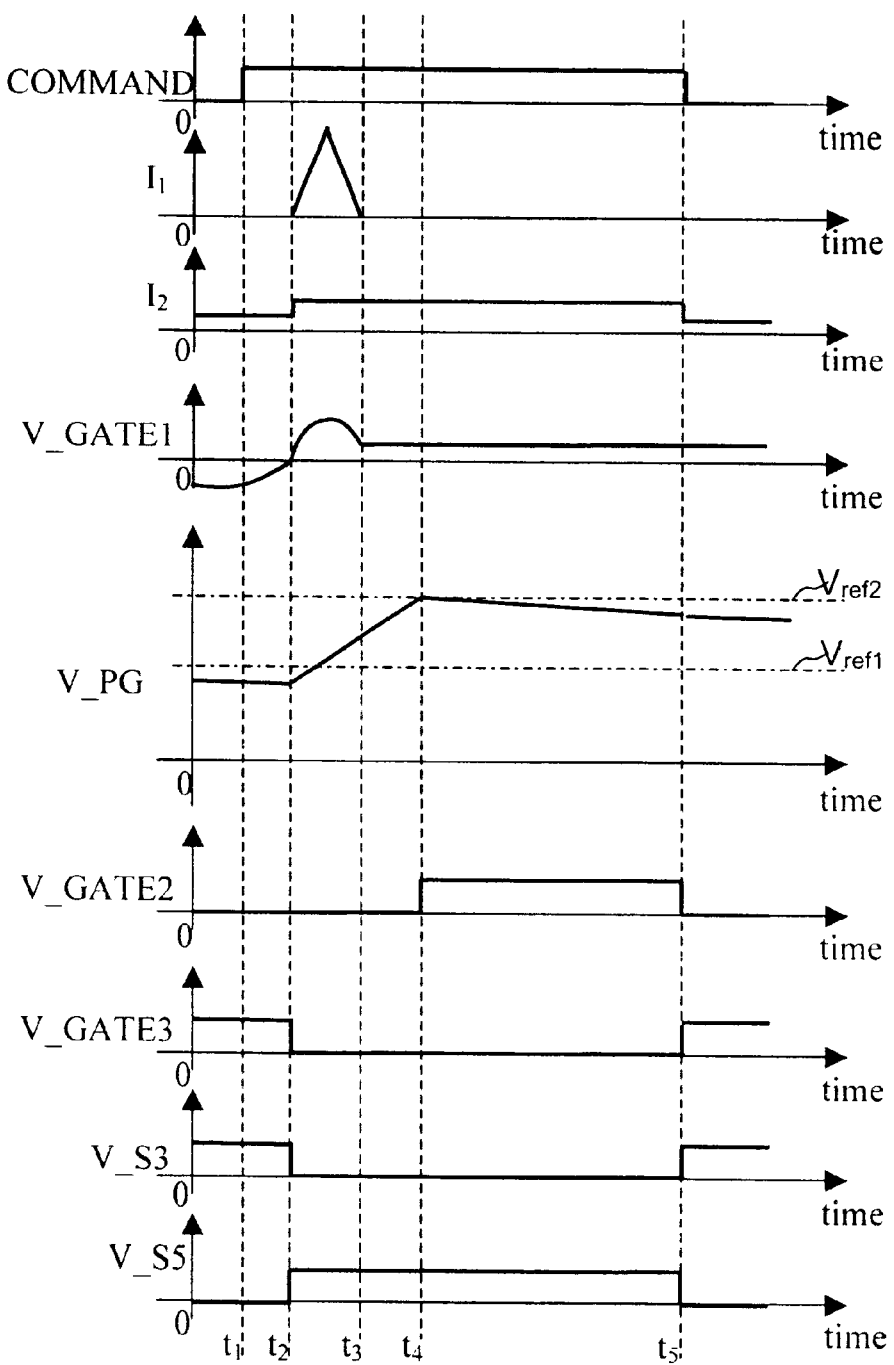
FIG. 12 is an ETO thyristor driver timing diagram according to a seventh embodiment of the invention.

Referring now to FIG. 12 there is an ETO thyristor driver timing diagram also according to the eighth embodiment of the invention. In FIG. 12, COMMAND is the control signal to trig the on/off of the ETO thyristor; $I_1$ is the output of $CS_1$; $I_2$ is the output of $CS_2$; V_GATE1 is the voltage across GATE1 and KATHODE2; V_PG is the voltage across PG and KATHODE1; V_GATE2 is the voltage across GATE2 and the cathodes of the emitter switch $S_{11}$~$S_{1m}$; V_GATE3 is the voltage across GATE3 and the cathodes of the gate switch $S_{11}$~$S_{1n}$; V_S3 is the voltage across the gate and cathodes of $S_3$; $V_{13}$ S5 is the voltage across the gate and cathodes of $S_5$. At time $t_1$, COMMAND is high. Since V_GATE1 is negative, the ETO thyristor output of COMP is low. ETO thyristor is kept off. At time $t_2$, the voltage of the GTO thyristor's gate is higher than the ETO thyristor's cathode. At this time, both COMMAND and the output of COMP are high. Then the turn-on action is initiated by control circuit 2. $CS_1$ is trigged to inject a current pulse $I_1$ to GATE1. V_GATE3 is changed from high level to low level to turn off ETO thyristor's gate switch $S_{11}$~$S_{1n}$. V_S3 is changed from high level to low level to turn off CLAMP. V_S5 is changed from low level to high level to turn on $S_4$. Since $S_4$ is turned on, $I_2$, is increased. Since V_PG is lower than $V_{ref1}$ at this time, the output of COMP2 is low. So V_GATE2 is still low, and as a result, ETO thyristor's emitter switch $S_{11}$~$S_{1m}$ are still kept off. Since $S_{11}$~$S_{1m}$ is off, the ETO thyristor's anode current $I_a$ will charge $C_1$ through paralleled diodes $D_{11}$~$D_{1j}$, causing V_PG rising. At time $t_3$, $I_2$ decreases to zero. The current pulse injection finishes. The GTO thyristor's gate current is maintained only by $I_2$. At time $t_4$, V_PG rises to $V_{ref2}$. Control circuit 2 detects that the output of COMP3 turns to high, and then changes V_GATE2 from low level to high level to turn on ETO thyristor's emitter switch $S_{11}$~$S_{1m}$. At time $t_4$, COMMAND is low. The turn-off action is initiated by control circuit 2 immediately. V_GATE2 is changed from high level to low level to turn off ETO thyristor's emitter switch $S_{11}$~$S_{1m}$. V_GATE3 is changed from low level to high level to turn on ETO thyristor's gate switch $S_{11}$~$S_{1n}$. Since ETO thyristor's emitter switch $S_{11}$~$S_{1m}$ are turned off, there will be a positive voltage, which is clamped by $C_1$ inside the ETO thyristor, generated across the emitter and the drain of $S_{11}$~$S_{1m}$, forcing the current divert from the cathode to the gate of the GTO thyristor, to achieve so-called unity turn-off gain. V_S3 is changed from low level to high level to turn on CLAMP so as to make gate of the GTO thyristor reverse bias during its off state. V_S5 is changed from high level to low level to turn off $S_4$. Since $S_4$ is turned off, $I_2$ is decreased. As a result, the drive circuit power is saved.

Figure 13:
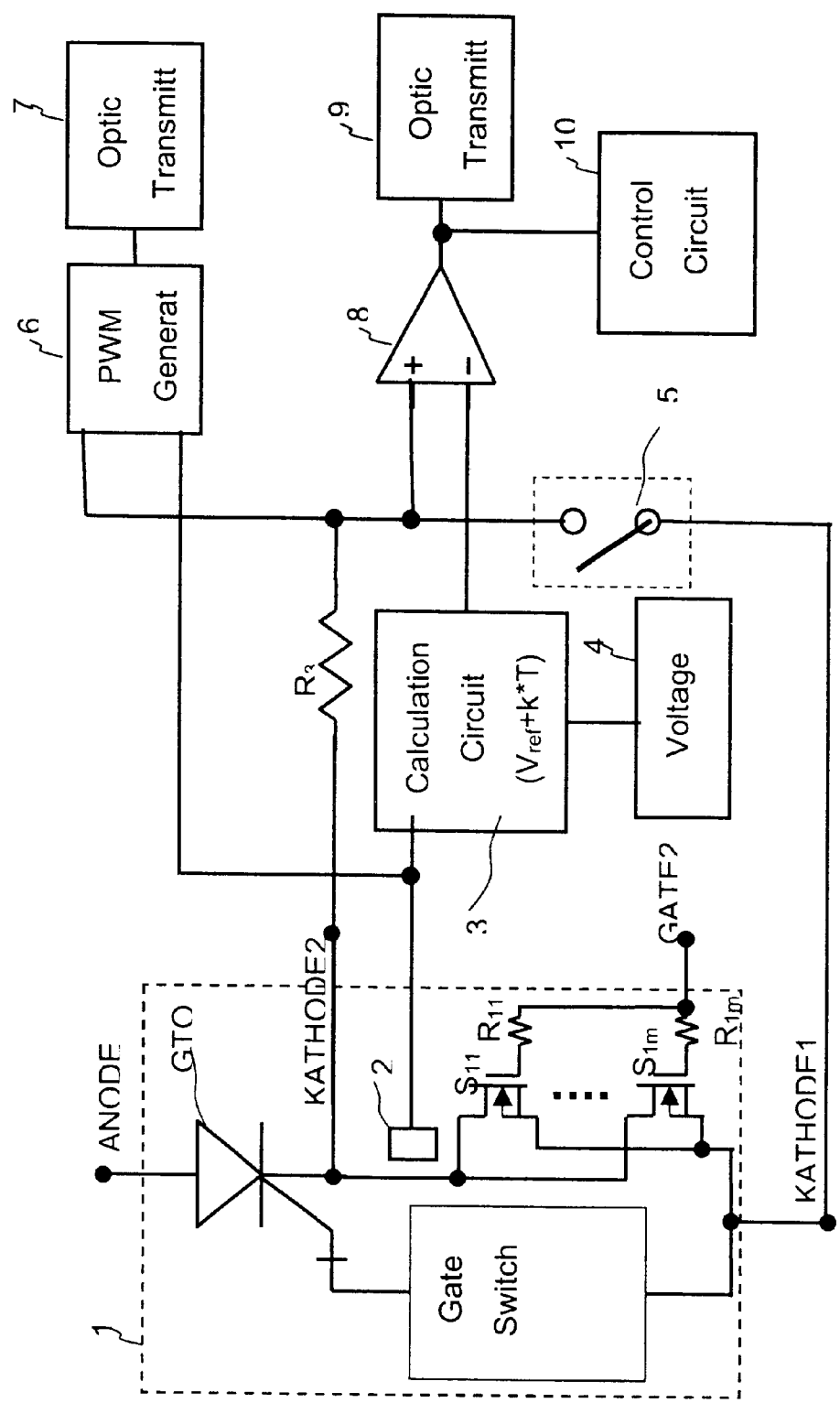
FIG. 13 is an ETO thyristor current sensing and overcurrent detector circuit diagram according to an eighth embodiment of the invention.

Referring now to FIG. 13 there is an ETO thyristor current sensing and over-current detector circuit diagram according to a ninth embodiment of the invention. When the ETO thyristor's emitter switch $S_{11}$~$S_{1m}$ are on, it acts as a small linear resistor. So the voltage drop across $S_{11}$~$S_{1m}$' drain and source reflects the current through it. The temperature of the junctions of ETO thyristor's emitter switch $S_{11}$~$S_{1m}$ is taken in to account to eliminate the temperature effect on the on resistance of $S_{11}$~$S_{1m}$. The PWM signal whose duty cycle is proportional to voltage across the $S_{11}$~$S_{1m}$' drain and source and whose cycle is related to the junction temperature of $S_{11}$~$S_{1m}$. The PWM signal is send out by optical signal. The voltage across the $S_{11}$~$S_{1m}$' drain and source is also used for ETO thyristor's over current protection. If this voltage is high enough, a over-current warning will be trigged. In the depicted example, the current sensing circuit includes a temperature sensor 2, PWM waveform generator 6, a resistor $R_3$, a switch 5, and optic transmitter 7. The relationship among the voltage, current and temperature of switch $S_1$ can be expressed by the following equation:

$$I = \frac{V}{V_{ref} + k \times T},$$

where I is the current, V is the voltage, and $V_{ref}$ and k are the parameters related to the thyristor's emitter switch $S_{11}$~$S_{1m}$. The temperature sensor 2 gets the temperature signal of thyristor's emitter switch $S_{11}$~$S_{1m}$ and sends it to the PWM generator 6. The voltage V of the drains of thyristor's emitter switch $S_{11}$~$S_{1m}$ are also detected by the PWM generator 6. The PWM generator 6 generates a PWM signal whose duty cycle is proportional to voltage V and whose cycle is related to the temperature of $S_{11}$~$S_{1m}$. The PWM signal is sent out by optic transmitter 7. And the current information can be used for current control. Switch 5 turns on when ETO thyristor turn off. This function makes sure V=0 when the ETO thyristor in off-state.

In the depicted example, the over-current detector circuit includes temperature sensor 2, voltage reference 4, calculation circuit 3, comparator 8 and optic transmitter 9. The over current trigger value can be set by the calculation circuit 3 as $V_{ref}$+kT. If voltage V is bigger than $V_{ref}$+kT, the over current signal can be generated by comparator 9. The over current signal can be received by the ETO thyristor's control circuit 10 to turn off the ETO thyristor immediately. It can also be sent out to the outside controller by optic transmitter 9.

Figure 14:
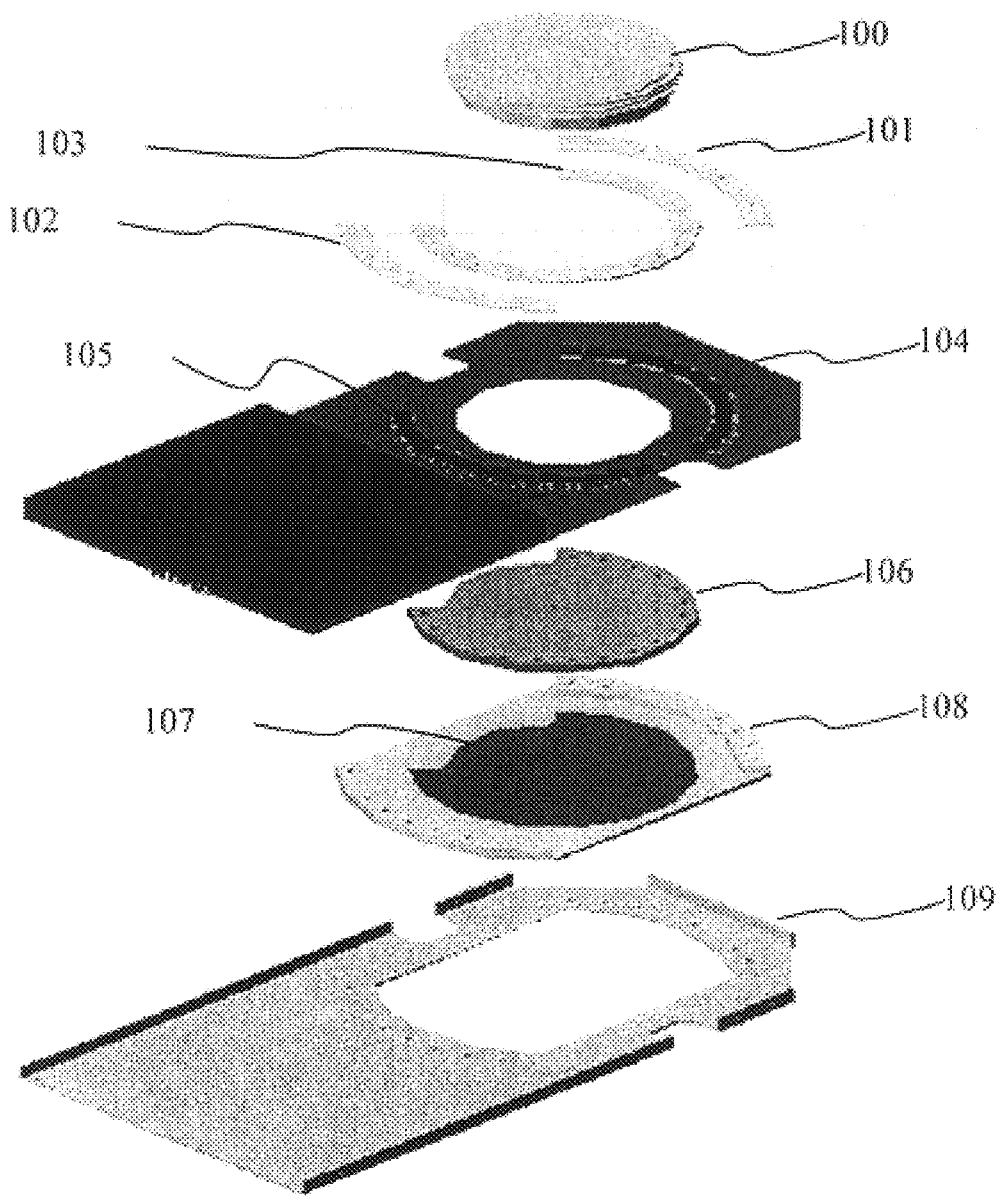
FIG. 14 is an assembly drawing schematically illustration the housing of an ETO thyristor according to a ninth embodiment of the invention.
Figure 15:
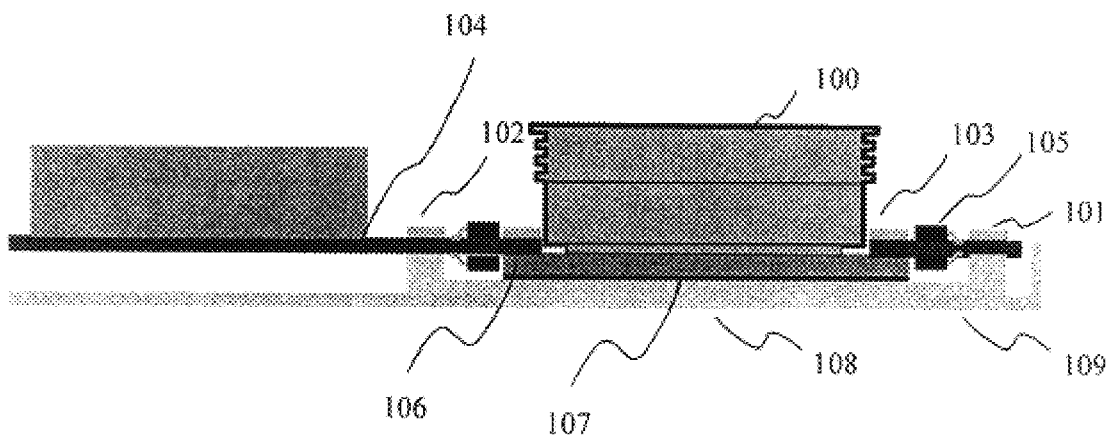
FIG. 15 is a cross-sectional view schematically illustration the housing of an ETO thyristor according to a ninth embodiment of the invention.

Referring now to FIG. 14 there is an assembly drawing schematically illustration the housing of an ETO thyristor according to a tenth embodiment of the invention. Also Referring now to FIG. 15 there is a cross section view schematically illustration the housing of an ETO thyristor also according to a tenth embodiment of the invention. The housing includes a GTO thyristor 100, a printed circuit board (PCB) 104, the emitter switch 105, a case 109, an insulator 107 and metal plates 101, 102, 103, 106, and 108. The print circuit board (PCB) 104, metal plate 106, and metal plate 103 are assembled together by screws. A big hole is cut from the PCB 104 to let the cathode of the GTO thyristor 100 come into direct contact with metal plate 106. The emitter switch 105, which are many N-channel MOSFETs connected in parallel, are packaged in a circle along the hole. The drains of the emitter switch 105 are connected to the cathode of the GTO thyristor 100 by PCB 104 and metal plate 106. In this structure, the drains of the N-MOSFET are very close to the metal plate 104. The heat generated by the emitter switch 105 will be easily conducted to metal plate 104, and the stray inductance between the GTO thyristor 100 and the emitter switch 105 is minimized. The emitter switch 105 can also be put on both sides of PCB 104 to increase the number of emitter switch so that the current handling capability can be improved. The sources of the emitter switch 105 are connected with the metal plate 108 through PCB 104, so the metal plate 108 acts as the ETO thyristor's cathode. Metal plates 108 and 106 are insulated from each other by insulator 107. Metal case 109 is used to support the whole device. The middle part is cut off to expose the metal plate 108 out. So the heat can transfer directly from metal plate 108 to the heat sink outside.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. An emitter turn-off (ETO) thyristor comprising:
    a gate turn-on (GTO) thyristor having an anode, a cathode and a gate;
    a first switch, consisting of a number of paralleled metal oxide semiconductor field effect transistors (MOSFETs), having a drain, a source and a gate, the drain of the first switch being connected to the cathode of the GTO thyristor; and
    a second switch connected between the gate of the GTO thyristor and the source of the first switch, said second switch having a control electrode, the anode of the GTO thyristor and the source of the first switch serving as the annode and the cathode, respective, of the ETO thyristor, the ETO thyristor having four control electrodes, the gate of the GTO thyristor, the control electrode of the second switch, the gate of the first switch, and the cathode of the GTO thyristor.

2. The ETO thyristor of claim 1, wherein the second switch consists of a number of paralleled MOSFETs and has a source, drain and a gate, the gate being said control electrode, further comprising a diode which is connected in series with the second switch, the diode serving to block current from the source of the first switch to the anode of the GTO thyristor.

3. The ETO thyristor of claim 2, wherein to turn off the ETO thyristor, the first switch is turned off and the second switch is turned on, and to turn on the ETO thyristor, the first switch is turned on, the second switch is turned off, and current is injected into the gate of the GTO thyristor.

4. The ETO thyristor of claim 3, wherein to turn off the ETO thyristor, a positive clamp voltage is further applied between the cathode and the gate of the GTO thyristor to make the gate of the GTO thyristor reverse bias, and to turn on the ETO thyristor, the positive clamp voltage between cathode and the gate of the GTO thyristor is further removed.

5. The ETO thyristor of claim 3, further comprising:
    a current direction detector connected to the gate of the GTO thyristor and the source of the first switch;
    a diode connected anti-parallel with the ETO thyristor; and
    a control circuit connected to the gates of the first and second switches and responsive to the current direction detector and, if the current direction detector detects that the diode is conducting current, keeping the ETO transistor in an off state.

6. The ETO thyristor of claim 2, further comprising a drive circuit comprising:
    a current source circuit connected between the source of the first switch and the gate of the GTO thyristor;
    a pulse current injection and voltage clamp circuit connected between the gate and the cathode of the GTO thyristor;
    a current direction detector having first and second inputs respectively connected to the gate of the GTO thyristor and the source of the first switch, the current direction detector further having an output; and
    a control circuit connected to the output of the current direction detector and providing control signals to the first and second switches, the current source circuit and the pulse current injection and voltage clamp circuit.

7. The ETO thyristor of claim 6, wherein the current source circuit comprises:
    a first voltage source;
    a second diode;
    a PNP power transistor having an emitter, collector and base, the first voltage source being connected between the source of the first switch and the emitter of the PNP power transistor and the second diode being connected between the collector of the PNP power transistor and the gate of the GTO thyristor;
    first and second resistors connected in series between the base of the PNP power transistor and the source of the first switch; and
    a control transistor having an emitter, a collector and a base, the emitter and collector of the control transistor being connected across one of said first and second resistors.

8. The ETO thyristor of claim 6, wherein the voltage clamp circuit comprises:
    a second voltage source having a positive junction and a negative junction;
    a MOSFETs having a source, a drain and a gate; and
    a third diode, the second voltage source, the MOSFET and the third diode being connected in series between the source of the first switch and the cathode of the GTO thyristor.

9. The ETO thyristor of claim 6, wherein the current direction detector comprises:
    a comparator having positive input connected to the gate of the GTO thyristor and negative input connected to the source of the first switch and, the comparator's output changing to high level if the voltage of the GTO thyristor's gate is lower than that of the first switch's source, indicating that the ETO thyristor's anti-parallel diode is conducting current.

10. The ETO thyristor of claim 1, wherein the second switch consists of a number of paralleled insulated gate bipolar transistors and has a collector, an emitter and a base, the base being the control electrode of the second switch, the collector of the second switch being connected to the gate of the GTO thyristor, and the emitter of the second switch being connected to the source of the first switch.

11. The ETO thyristor of claim 10, wherein to turn off the ETO thyristor, the first switch is turned off and the second switch is turned on, and to turn on the ETO thyristor, the first switch is turned on, the second switch is turned off, and current is injected into the gate of the GTO thyristor, the second switch blocking current from the source of the first switch to the anode of the GTO thyristor when the voltage of source of the first switch is higher than the voltage of the anode of the GTO thyristor.

12. The ETO thyristor of claim 11, wherein to turn off the ETO thyristor, a positive clamp voltage is further applied between cathode and gate of the GTO thyristor to make the gate of the GTO thyristor reverse bias, and to turn on the ETO thyristor, the positive clamp voltage between cathode and gate of the GTO thyristor is removed.

13. The ETO thyristor of claim 11, further comprising:
    a current direction detector connected to the gate of the GTO thyristor and the source of the first switch;
    a diode connected anti-parallel with the ETO thyristor; and
    a control circuit connected to the gates of the first and second switches and responsive to the current direction detector and, if the current direction detector detects that the diode is conducting current, keeping the ETO thyristor in an off state.

14. The ETO thyristor of claim 10, further comprising a drive circuit comprising:
   a current source circuit connected between the source of the first switch and the gate of the GTO thyristor;
   a pulse current injection and voltage clamp circuit connected between the gate and the cathode of the GTO thyristor;
   a current direction detector having first and second inputs respectively connected to the gate of the GTO thyristor and the source of the first switch, the current direction detector further having an output; and
   a control circuit connected to the output of the current direction detector and providing control signals to the first and second switches, the current source circuit and the pulse current injection and voltage clamp circuit.

15. The ETO thyristor of claim 14, wherein the current source circuit comprises:
   a first voltage source;
   a first diode having a cathode and an anode;
   a PNP power transistor, having an emitter, collector and base, the first voltage source being connected between the source of the first switch and the emitter of the PNP power transistor, the collector of the PNP power transistor being connected to the cathode of the first diode, and the anode of the first diode being connected to the gate of the GTO thyristor;
   first and second resistors connected in series between the base of the PNP power transistor and the source of the first switch; and
   a control transistor having an emitter, a collector and a base, the emitter and collector of the control transistor being connected across one of said first and second resistors.

16. The ETO thyristor of claim 14, wherein the voltage clamp circuit comprises:
   a second voltage source;
   a MOSFET, having a source, a drain and a gate; and
   a second diode, the second voltage source, the MOSFET and the second diode being connected in series between the source of the first switch and the cathode of the GTO thyristor.

17. The ETO thyristor of claim 14, wherein the current direction detector comprises:
   a comparator having positive input connected to the gate of the GTO thyristor and negative input connected to the source of the first switch and, the comparator's output changing to high level if the voltage of the GTO thyristor's gate is lower than that of the first switch's source, indicating that the ETO thyristor's anti-parallel diode is conducting current.

18. The ETO thyristor of claim 1, wherein the second switch consists of a series circuit of a switch and a capacitor, the gate of the switch being the control electrode of the second switch, further comprising the diode connected in parallel with the switch, and the second diode connected in parallel with the capacitor.

19. The ETO thyristor of claim 18, wherein to turn off the ETO thyristor, the first switch is turned off and the second switch is turned off, current going out of the gate of the GTO thyristor charges the capacitor through the second switch, and to turn on the ETO thyristor, the first switch is turned on and the second switch is turned on, the capacitor providing turn on current to inject into the gate of the GTO thyristor, the second diode providing a current free wheeling path when die capacitor is discharged.

20. The ETO thyristor of claim 19, wherein to turn off the ETO thyristor, a positive clamp voltage is further applied between the cathode and gate of the GTO thyristor to make the gate of the GTO thyristor reverse bias, and to turn on the ETO thyristor, the positive clamp voltage between the cathode and gate of the GTO thyristor is removed, the second switch blocking current from the source of the first switch to the anode of the GTO thyristor when the voltage of the source of the first switch is higher than the voltage of the anode of the GTO thyristor.

21. The ETO thyristor of claim 19, further comprising:
   a current direction detector connected to the gate of the GTO thyristor and the source of the first switch;
   a diode connected anti-parallel with the ETO thyristor; and
   a control circuit connected to the gates of the first and second switches and responsive to the current direction detector and, if the current direction detector detects that the diode is conducting current, keeping the ETO thyristor in an off state.

22. The ETO thyristor of claim 18, further comprising a drive circuit comprising:
   a current source circuit connected between the source of the first switch and the gaze of the GTO thyristor;
   a voltage clamp circuit connected between the gate and the cathode of the GTO thyristor;
   a current direction detector having first and second inputs respectively connected to the gate of the GTO thyristor and the source of the first switch, the current direction detector further having an output; and
   a control circuit connected to the output of the current direction detector and providing control signals to the first and second switches, the current source circuit and the pulse current injection and voltage clamp circuit.

23. The ETO thyristor of claim 22, wherein the current source circuit comprises:
   a first voltage source;
   a third diode having a cathode and an anode;
   a PNP power transistor, having an emitter, collector and base, the first voltage source being connected between the source of the first switch and the emitter of the PNP power transistor, the collector of the PNP power transistor being connected to the cathode of the third diode, and the anode of the third diode being connected to the gate of the GTO thyristor;
   first and second resistors connected in series between the base of the PNP power transistor and the source of the first switch; and
   a control transistor having an emitter, a collector and a base, the emitter and collector of the control transistor being connected across one of said first and second resistors.

24. The ETO thyristor of claim 22, wherein the voltage clamp circuit comprises:
   a second voltage source;
   a MOSFET, having a source, a drain and a gate; and
   a fourth diode, the second voltage source, the MOSFET and the diode being connected in series between the source of the first switch and the cathode of the GTO thyristor.

25. The ETO thyristor of claim 1, further comprising:
a series circuit of a first diode and a capacitor, and this series circuit being connected in parallel with the first switch.

26. The ETO thyristor of claim 25, further comprising:
a precharge circuit connected to the anode of the GTO thyristor and one terminal of the capacitor, charging the capacitor to a certain voltage when the ETO thyristor being first powered on.

27. The ETO thyristor of claim 25, wherein to turn off the ETO thyristor, the second switch is turned on and the first switch is turned off, the voltage across the first switch being clamped by the capacitor, and to tuna on the ETO thyristor, the second switch is turned off, and current is injected into the gate of the GTO thyristor.

28. The ETO thyristor of claim 27, wherein to turn on the ETO thyristor, the voltage across the capacitor is measured first, and the turn-on of the first switch will be delayed in order to charge the capacitor by ETO thyristor's anode current if the voltage across the capacitor is low than a first voltage value, and the first switch will not be turned on until the voltage across the capacitor reaches a second voltage value, which is higher than the first voltage value.

29. The ETO thyristor of claim 28, wherein during the ETO thyristor's on-state, the voltage across the capacitor is measured, and the first switch will be turned off in order to charge the capacitor by ETO thyristor's anode current if the voltage across the capacitor is low than a first voltage value, and the first switch will not be turned on until the voltage across the capacitor reaches a second voltage value, which is higher than the first voltage value.

30. The ETO thyristor of claim 27, wherein to turn off the ETO thyristor, a positive clamp voltage is further applied between the cathode and the gate of the GTO thyristor to make the gate of the GTO thyristor reverse bias, and to turn on the ETO thyristor, the positive clamp voltage between cathode and the gate of the GTO thyristor is further removed.

31. The ETO thyristor of claim 27, further comprising:
a current direction detector connected to the anode of the GTO thyristor and the source of the first switch;
a second diode connected anti-parallel with the ETO thyristor; and
a control circuit connected to the gates of the first and second switches and responsive to the current direction detector and, if the current direction detector detects that the second diode is conducting current, keeping the ETO thyristor in an off state.

32. The ETO thyristor of claim 25, further comprising a drive circuit comprising:
a current source circuit connected between the gate and the cathode of the GTO thyristor;
a pulse current injection and voltage clamp circuit connected between the gate and the cathode of the GTO thyristor; and
a current direction detector having first and second inputs respectively connected to the anode of the GTO thyristor and the source of the first switch, the current direction detector further having an output; and
a capacitor voltage precharge circuit connected to the anode of the GTO thyristor and one terminal of the capacitor; and
a zenor diode connected in parallel with the capacitor to limit the voltage across the capacitor; and
a voltage detector to measure the voltage across the capacitor; and
a control circuit connected to the output of the current direction detector and providing control signals to the first and second switches, the current source circuit and the pulse current injection and voltage clamp circuit; and
a DC—DC converter having two input terminals connected to the two terminals of the capacitor respectively, the DC—DC converter providing power for the control circuit, current source circuit, the pulse current injection, voltage detector, and voltage clamp circuit.

33. The ETO thyristor of claim 32, wherein the current source circuit comprises:
a first voltage source;
a third diode;
a PNP power transistor having an emitter, collector and base, the first voltage source being connected between the source of the first switch and the emitter of the PNP power transistor and the third diode being connected between the collector of the PNP power transistor and the gate of the GTO thyristor;
first and second resistors connected in series between the base of the PNP power transistor and the source of the first switch; and
a control transistor having an emitter, a collector and a base, the emitter and collector of the control transistor being connected across one of said first and second resistors.

34. The ETO thyristor of claim 32, wherein the voltage clamp circuit comprises:
a second voltage source having a positive junction and a negative junction;
a MOSFETs having a source, a drain and a gate; and
a fourth diode, the second voltage source, the MOSFET and the fourth diode being connected in series between the source of the first switch and the cathode of the GTO thyristor.

35. The ETO thyristor of claim 32, wherein the current direction detector comprises:
a series circuit of two resistors connected to the anode of the GTO thyristor and the source of the first switch, serving as the voltage divider;
a first comparator having the output connected to the control circuit, and having positive and negative inputs connected to the two terminals of one of the resistors, the first comparator's output changing to high level if the voltage of the GTO thyristor's anode is lower than that of the first switch's source, indicating that the ETO thyristor's anti-parallel diode is conducting current.

36. The ETO thyristor of claim 32, wherein the voltage detector comprises:
a second comparator having the output connected to the control circuit, and having the positive input connected to the capacitor's one terminal, and having the negative input connect to a first voltage reference; and
a third comparator having the output connected to the control circuit, and having the positive input connected to the capacitor's one terminal, and having the negative input connect to a second voltage reference, which is lower that the first voltage reference.

37. The ETO thyristor of claim 1, further comprising a current sensing and over-current detector circuit connected between the cathode of the GTO thyristor and the source of the first switch.

38. The ETO thyristor of claim 37, wherein the current sensing and over-current detector circuit comprises:

a temperature sensor proximate to the drain of the first switch and generating a first voltage signal proportional to a sensed temperature T;

a voltage reference providing a reference voltage $V_{ref}$;

a calculation circuit receiving the first voltage signal and the reference voltage and calculating $V_{ref}+k \times T$, where k is a parameter related to the first switch; and a pulse width modulated (PWM) waveform generator connected to receive an output from the temperature sensor and also connected to the drain of the first switch to detect a voltage V of the drain of the first switch, the PWM waveform generator generating a PWM signal whose duty cycle is proportional to voltage V and whose cycle is proportional to T.

39. The ETO thyristor of claim 38, further comprising an optic transmitter connected to an output of the PWM waveform generator.

40. The ETO thyristor of claim 39, further comprising:

a comparator having first and second inputs respectively connected to the output of the calculation circuit and to the drain of the first switch, the comparator further generating an output when an over current condition is detected when the voltage V is larger than $V_{ref}+k \times T$;

a control logic circuit responsive to the output of the comparator indicating an over current condition to turn off the ETO thyristor immediately.

41. The ETO thyristor of claim 39, further comprising a second optic transmitter condition output from the comparator.

42. The ETO thyristor of claim 1, further comprising a housing for the ETO thyristor.

43. The ETO thyristor of claim 42, wherein the housing comprises:

plurality of MOSFETs connected in parallel constituting the first switch being packaged in a printed circuit board (PCB).

44. The ETO thyristor of claim 43, wherein the housing comprises:

a PCB having a large hole for receiving the cathode of the GTO thyristor;

a first metal plate on a first side of the PCB in contact with the cathode of the GTO thyristor;

a second metal plate on a second side of the PCB and encircling the GTO thyristor, the PCB, the first metal plate and the second metal plate being assembled by screws; and plurality of MOSFETs connected in parallel constituting the first switch being packaged in a circle about the hole in the PCB, drains of the MOSFETs being connected to the cathode of the GTO thyristor the PCB and the first metal plate, so that heat generated by the MOSFETs will be easily conducted to the first metal plate and stray inductance between the GTO thyristor and the MOSFETs is minimized.

45. The ETO thyrsitor of claim 43, wherein the MOSFETs mounted on both sides of the PCB to increase the number of switches so that the current handling capability is improved.

46. The ETO thyristor of claim 44, further comprising:

a third metal plate to which sources of the MOSFETs are connected through the PCB; and an insulator between the first metal plate and the third metal plate, the third metal plate acting as the ETO thyristor's cathode.

* * * * *

UNITED STATES PATENT AND TRADEMARK OFFICE
CERTIFICATE OF CORRECTION

PATENT NO. : 6,710,639 B2
DATED : March 23, 2004
INVENTOR(S) : Huang et al.

Figure 16:
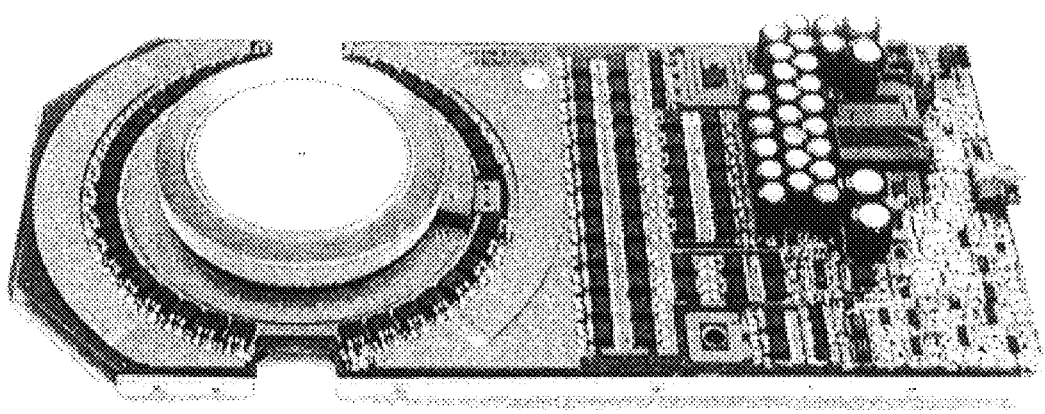

It is certified that error appears in the above-identified patent and that said Letters Patent is hereby corrected as shown below:

Drawings,
Please remove Figure 16.

Signed and Sealed this

Twenty-ninth Day of June, 2004

JON W. DUDAS
*Acting Director of the United States Patent and Trademark Office*